(12) United States Patent
Ryan

(10) Patent No.: US 6,869,879 B1
(45) Date of Patent: Mar. 22, 2005

(54) METHOD FOR FORMING CONDUCTIVE INTERCONNECTS

(75) Inventor: Errol Todd Ryan, Austin, TX (US)

(73) Assignee: AdvancedMicro Devices, Inc., Austin, TX (US)

(*) Notice: Subject to any disclaimer, the term of this patent is extended or adjusted under 35 U.S.C. 154(b) by 728 days.

(21) Appl. No.: 09/706,043

(22) Filed: Nov. 3, 2000

(51) Int. Cl.[7] .......................................... H01L 21/302
(52) U.S. Cl. .................... 438/689; 438/706; 438/733; 438/723; 438/724; 216/17; 216/18; 216/74
(58) Field of Search ............................... 438/689, 691, 438/706, 733, 692; 216/17, 18, 74

(56) References Cited

U.S. PATENT DOCUMENTS

| | | | | |
|---|---|---|---|---|
| 5,817,572 A | * | 10/1998 | Chiang et al. | 438/624 |
| 5,821,169 A | * | 10/1998 | Nguyen et al. | 216/41 |
| 5,847,460 A | * | 12/1998 | Liou et al. | 257/635 |
| 5,877,076 A | * | 3/1999 | Dai | 438/597 |
| 5,982,035 A | * | 11/1999 | Tran et al. | 257/750 |
| 6,010,965 A | * | 1/2000 | Shields | 438/700 |
| 6,025,273 A | * | 2/2000 | Chen et al. | 438/706 |
| 6,103,623 A | * | 8/2000 | Lien et al. | 438/636 |
| 6,124,165 A | * | 9/2000 | Lien | 438/132 |
| 6,140,024 A | * | 10/2000 | Misium et al. | 430/314 |

OTHER PUBLICATIONS

Wolf, S. and Tauber,R.N., "Silicon Processing for the VLSI Era", vol. 2, pp.20–27.*

* cited by examiner

Primary Examiner—Nadine G. Norton
Assistant Examiner—Shamim Ahmed
(74) Attorney, Agent, or Firm—Williams, Morgan & Amerson

(57) ABSTRACT

A method is provided for forming a conductive interconnect in a semiconductor device. The method comprises forming a dielectric layer above a structure layer, forming a cap layer above the dielectric layer, forming a photoresist layer above the cap layer, and forming an opening in the photoresist layer. A first anisotropic etch is performed into a region of the cap layer underlying the opening in the photoresist layer to form an etched region in the cap layer, leaving a portion of the cap layer in the etched region. The pattern in the photoresist is transferred into the cap layer. The photoresist layer is removed from above the cap layer while the remaining portion of the cap layer in the etched region protects the dielectric layer from damage by the photoresist removal process. A second anisotropic etch is performed to form an opening in the dielectric layer, the opening in the dielectric layer having a sidewall. A barrier layer is formed above at least the sidewall of the opening in the dielectric layer, and a conductive material is deposited to fill at least the opening in the dielectric layer.

123 Claims, 28 Drawing Sheets

METHOD FOR FORMING CONDUCTIVE INTERCONNECTS

BACKGROUND OF THE INVENTION

1. Field of the Invention

This invention relates generally to semiconductor fabrication technology, and, more particularly, to techniques for the formation of conductive interconnects.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to contacts to active areas, such as $N^+$ ($P^+$) source/drain regions and a doped-polycrystalline silicon (doped-polysilicon or doped-poly) gate conductor, and the like. As the size and cross-sectional dimensions of electrical interconnects get smaller, resistance increases and electromigration increases. Aluminum (Al) is most often used for interconnects in contemporary semiconductor fabrication processes primarily because aluminum is inexpensive and easier to etch than, for example, copper (Cu). However, aluminum has poor electromigration characteristics and higher resistivity than other metals, including copper.

As a result of the difficulty in etching copper, when it is used, an alternative approach to forming vias and metal lines is typically employed. The damascene approach, consisting of etching openings such as trenches in the dielectric for lines and vias and creating in-laid metal patterns, is the leading contender for fabrication of sub-0.25 micron (sub-$0.25\mu$) design rule copper-metallized (Cu-metallized) circuits.

In the damascene approach, vias, contact openings and trenches, for example, may be formed in and through dielectric layers and other process layers using known photolithography techniques. A layer or film of copper is then formed over the surface of the dielectric, filling the openings and trenches. The excess copper is then removed by polishing, grinding, and/or etching, such as by chemical/mechanical polishing, to leave only the copper in the openings or trenches, which form the copper interconnects.

Additionally, as semiconductor device geometry continues to shrink, providing insulating material between conductive layers or interconnects becomes more problematic. Improved dielectric materials having low dielectric constants, for example, 4.0 and lower, have been developed. By using these "low k" materials, dielectric layers may be formed somewhat thinner while maintaining the needed insulative characteristics. However, these low k dielectric films may be damaged by etching and ashing processes associated with the use of photoresist masks, for example. Damage to these low k dielectric films due to photoresist ash processes can lead to increased line-to-line capacitance, leakage, poor interface adhesion with barrier metals and passivation layers, and decreased reliability. Further, these low k dielectric films contain nitrogen impurities that can cause DUV photoresist poisoning if the photoresist is in direct contact with the low k material.

The present invention is directed to overcoming, or at least reducing the effects of, one or more of the problems set forth above.

SUMMARY OF THE INVENTION

In one aspect of the present invention, a method is provided for patterning a process layer in a semiconductor device. The method comprises forming the process layer above a structure layer, and forming a cap layer above the process layer. A photoresist layer is formed above the cap layer, and an opening is formed in the photoresist layer. The method further comprises performing a first anisotropic etch into a region of the cap layer underlying the opening in the photoresist layer to form an etched region in the cap layer, leaving a portion of the cap layer in the etched region. The photoresist layer is removed from above the cap layer, and a second anisotropic etch is performed to form an etch pattern in the process layer. The structure layer may comprise, for example, a semiconductor substrate, a layer of conductive material, or other appropriate process layer.

In another aspect of the present invention, a method is provided for forming a conductive interconnect in a semiconductor device. The method comprises forming a dielectric layer above a structure layer, forming a cap layer above the dielectric layer, forming a photoresist layer above the cap layer, and forming an opening in the photoresist layer. A first anisotropic etch is performed into a region of the cap layer underlying the opening in the photoresist layer to form an etched region in the cap layer, leaving a portion of the cap layer in the etched region. The photoresist layer is removed from above the cap layer, and a second anisotropic etch is performed to form an opening in the dielectric layer, the opening in the dielectric layer having a sidewall. A barrier layer is formed above at least the sidewall of the opening in the dielectric layer, and a conductive material is deposited to fill at least the opening in the dielectric layer. The method further comprises removing the cap layer.

In yet another aspect of the present invention, a method is provided for forming a conductive interconnect in a semiconductor device. The method comprises forming a first process layer above a structure layer, forming a second process layer above the first process layer, forming a mask above the second process, the mask having an opening therein, and performing a first anisotropic etch into a region of the second process layer underlying the opening in the mask. The method further comprises removing the mask from above the second process layer, performing a second anisotropic etch to form an opening in the first process layer, and depositing a conductive material into the opening in the first process layer.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
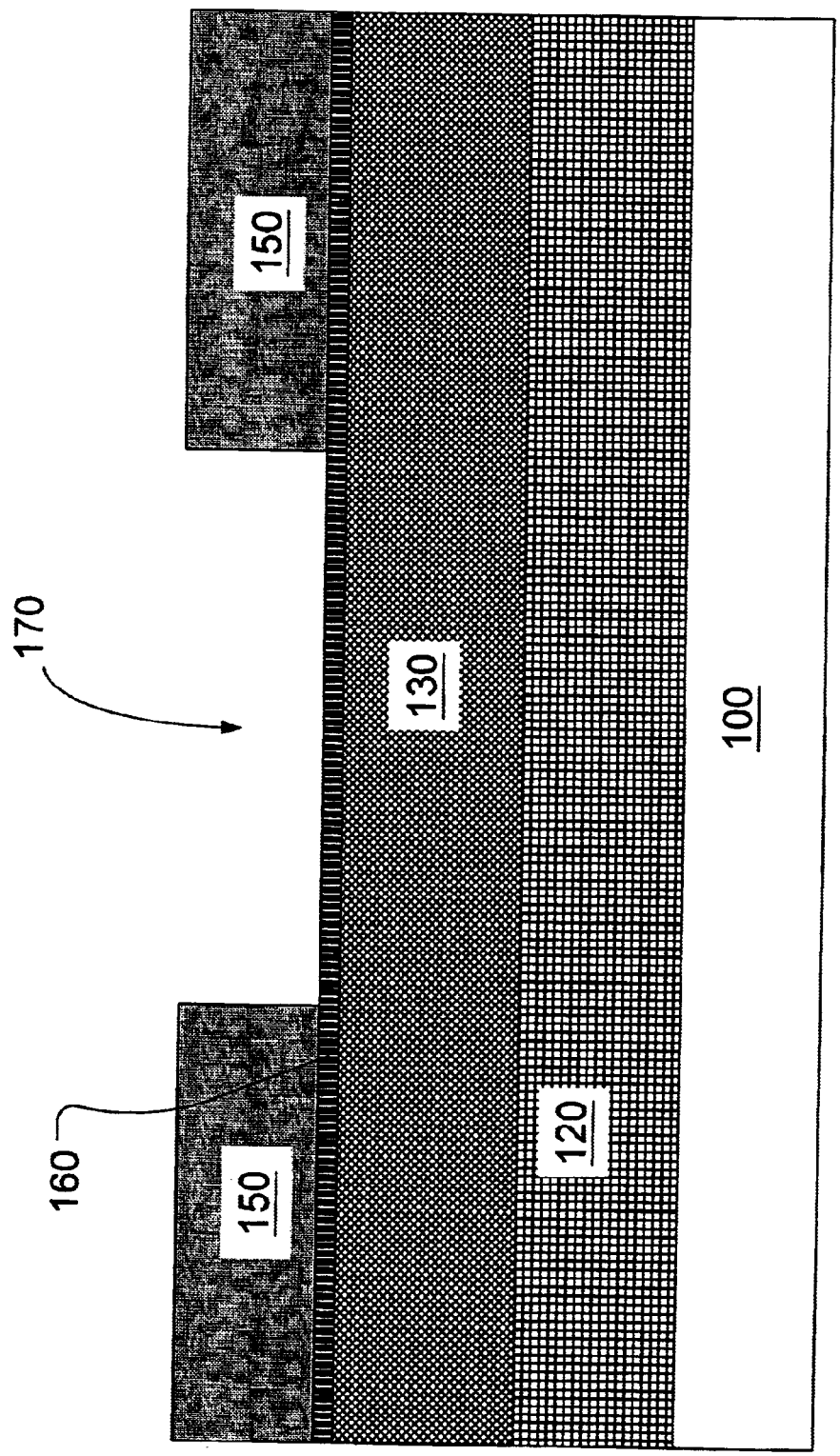
FIGS. 1–9 schematically illustrate a single-damascene copper interconnect process flow according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–28. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed to the manufacture of conductive interconnects in a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, a first process layer 120, for example, a dielectric layer 120, may be formed above a structure layer 100 such as a semiconducting substrate. However, the present invention is not limited to the formation of the process layer 120 above the surface of a semiconducting substrate such as a silicon wafer, for example. Rather, as will be apparent to one skilled in the art upon a complete reading of the present disclosure, the process layer 120 may be formed above previously formed semiconductor devices and/or process layer, e.g., transistors, or other similar structure. In effect, the present invention may be used to form process layers on top of previously formed process layers. The structure layer 100 may be an underlayer of semiconducting material, such as a silicon substrate or wafer, or, alternatively, may be an underlayer of semiconductor devices, such as a layer of metal oxide semiconductor field effect transistors (MOSFETs), and the like, and/or a metal interconnection layer or layers and/or an interlevel (or interlayer) dielectric (ILD) layer or layers, and the like.

In a single-damascene copper process flow that may embody the present invention, as shown in FIGS. 1–9, the dielectric layer 120 is formed above the structure layer 100. The dielectric layer 120 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and it may have a thickness ranging from approximately 3000 Å–8000 Å, for example.

The dielectric layer 120 may be formed from a variety of dielectric materials, including, but not limited to, silicon dioxide, silicon oxynitride, or other dielectric material having a relatively low dielectric constant (where k is less than or equal to about 4), although the dielectric materials need not have low dielectric constants. Examples include Applied Material's Black Diamond®, Novellus' Coral®, Allied Signal's Nanoglass®, JSR's LKD5104, and the like. In one illustrative embodiment, the dielectric layer 120 is comprised of Applied Material's Black Diamond®, and has a thickness of approximately 5000 Å, being formed by being blanket-deposited by an LPCVD process for higher throughput.

Thereafter, a second process layer 130 is formed above the first process layer 120, i.e., above the dielectric layer 120. The second process layer 130 in the illustrative embodiment is a cap layer comprised of tetraethyl orthosilicate (TEOS) oxide. Other materials suitable for forming the cap layer 130 include, but are not limited to, silicon nitride ($Si_3N_4$), silicon carbide (SiC) and silicon oxynitride (SiON). The cap layer 130 may be formed above the dielectric layer 120 by any suitable technique, including, for example, those techniques mentioned above. The cap layer 130 may, for example, be comprised of TEOS oxide deposited by a CVD process, and it may have a thickness ranging from approximately 500–1500 Å, for example. As will be more fully explained below, the thickness of the cap layer 130 will be chosen to compensate for etch selectivity. If desired, the second process layer 130 may be planarized using a chemical-mechanical polishing (CMP) process.

The second process layer 130 has an anti-reflective coating (ARC) layer 160, for example, silicon nitride, formed thereon. The layer 160 may be comprised of any material suitable for the desired function of the layer 160, including, for example, $Si_3N_4$, SiON and various organic materials. The layer 160 may perform various functions, including an anti-reflective function to reduce deleterious effects of the photolithography and etching processes on the resulting structures formed. The layer 160 may also act as an etch stop layer. The layer 160 may be formed above the second process layer, or cap layer, 130 by any suitable technique, including, for example, any suitable deposition technique. The ARC layer 160 may, for example, be comprised of silicon nitride deposited by a PECVD process, and it may have a thickness ranging from approximately 100–1000 Å, for example.

A mask is then formed by using a photoresist layer 150 and photolithography. For example, a layer 150 of photoresist material may be formed above the anti-reflective coating layer 160. An opening 170 may be formed in the photoresist layer 150 by using a variety of well-known photolithography techniques.

Figure 2:
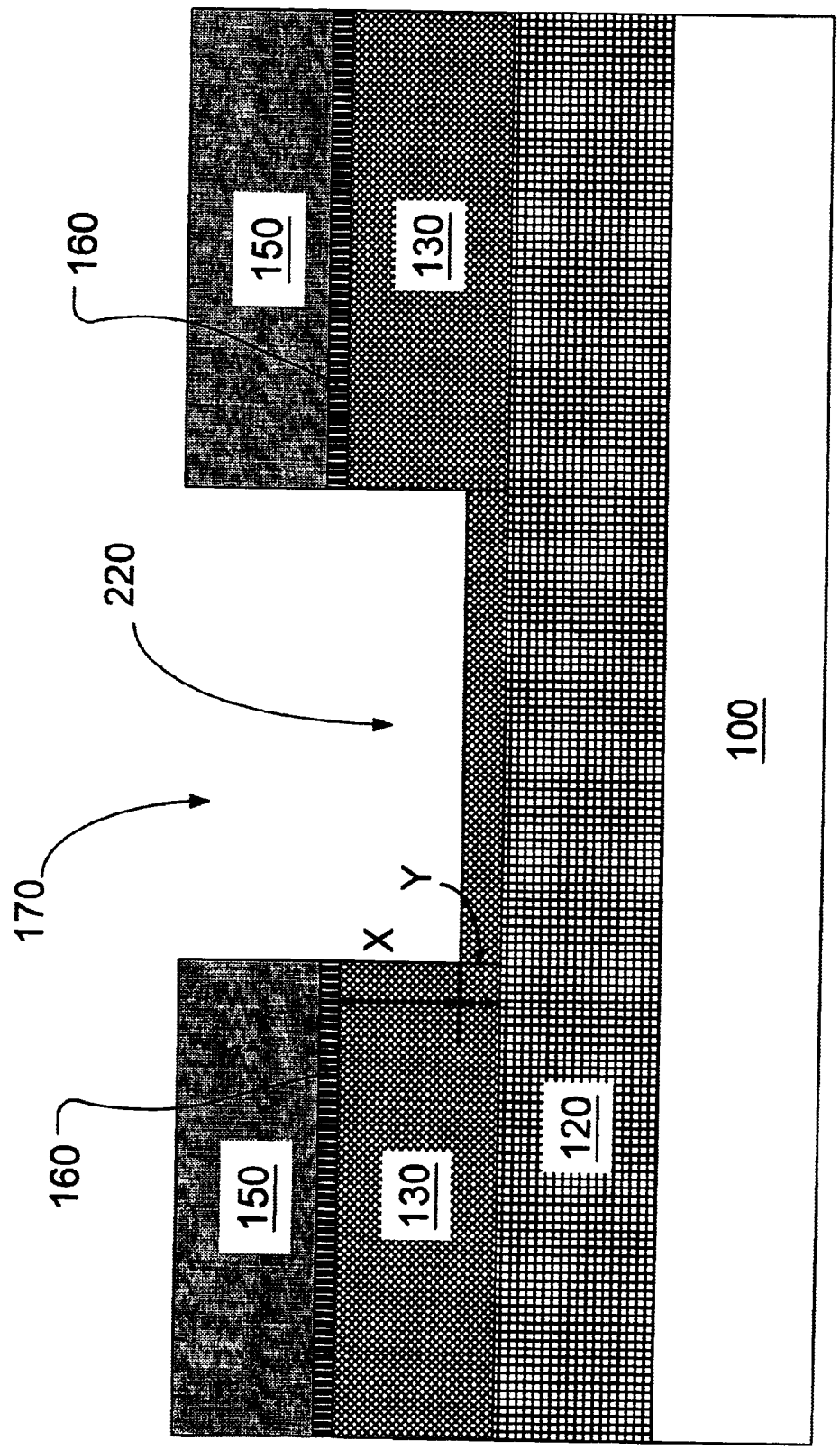

Referring now to FIG. 2, one or more anisotropic etching processes are performed through the ARC layer 160 and into the cap layer 130 underlying the opening 170 in the photoresist layer 150 to define an etched region 220 in the cap layer 130. A single anisotropic etching process may be employed to form the etched region 220, or two (or more) such processes may be employed—a first for the ARC layer 160 and a second for the cap layer 130. Any desired number of such processes may be employed as appropriate. The etched region 220 may be formed in the cap layer 130 by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used in various illustrative embodiments. The etched region 220 is formed in the cap layer 130 to a depth of "X," as shown in FIG. 2. The depth "X" is less than the total thickness of the cap layer 130, leaving a thickness "Y" of the cap layer 130 in the etched region 220 of the cap layer 130. After the anisotropic etching process, the thickness "Y" of the cap layer 130 will overlay the dielectric layer 120, protecting the dielectric layer 120 from any contamination or damage resulting from subsequent removal, for example by ashing, of the photoresist material 150. Moreover, the pattern in the photoresist mask, represented by the photoresist material 150 and the opening 170, has been transferred to the cap layer 130 by the anisotropic etching process.

The distance "X" to which the anisotropic etching process proceeds, as well as the thickness "Y" that is left remaining to overlay the process layer 120, are matters of design choice. Various considerations will determine the values of "X" and "Y," including but not limited to, the specific materials used to form the layers 120 and 130, the etch selectivity of a subsequent anisotropic etch (described below) to the materials of the layers 120 and 130, and the desired thickness of the cap layer 130 following the subsequent anisotropic etch (described below). For example, when the process layer 120 is comprised of any number of low dielectric films at a thickness of approximately 3000–7000 Å, and the cap layer 130 is comprised of TEOS oxide at a thickness of approximately 600–1500 Å, the distance "X" may be in the range of approximately 300–1000 Å and the thickness "Y" may be in the range of 300–500 Å, assuming substantially all of the cap layer 130 is to be removed during the subsequent anisotropic etching process (described below). If a substantial portion of the cap layer 130 is to remain following the subsequent anisotropic etching process, it may be desirable for "X" to be less than approximately 1000 Å and "Y" to be greater than approximately 500 Å.

Figure 3:
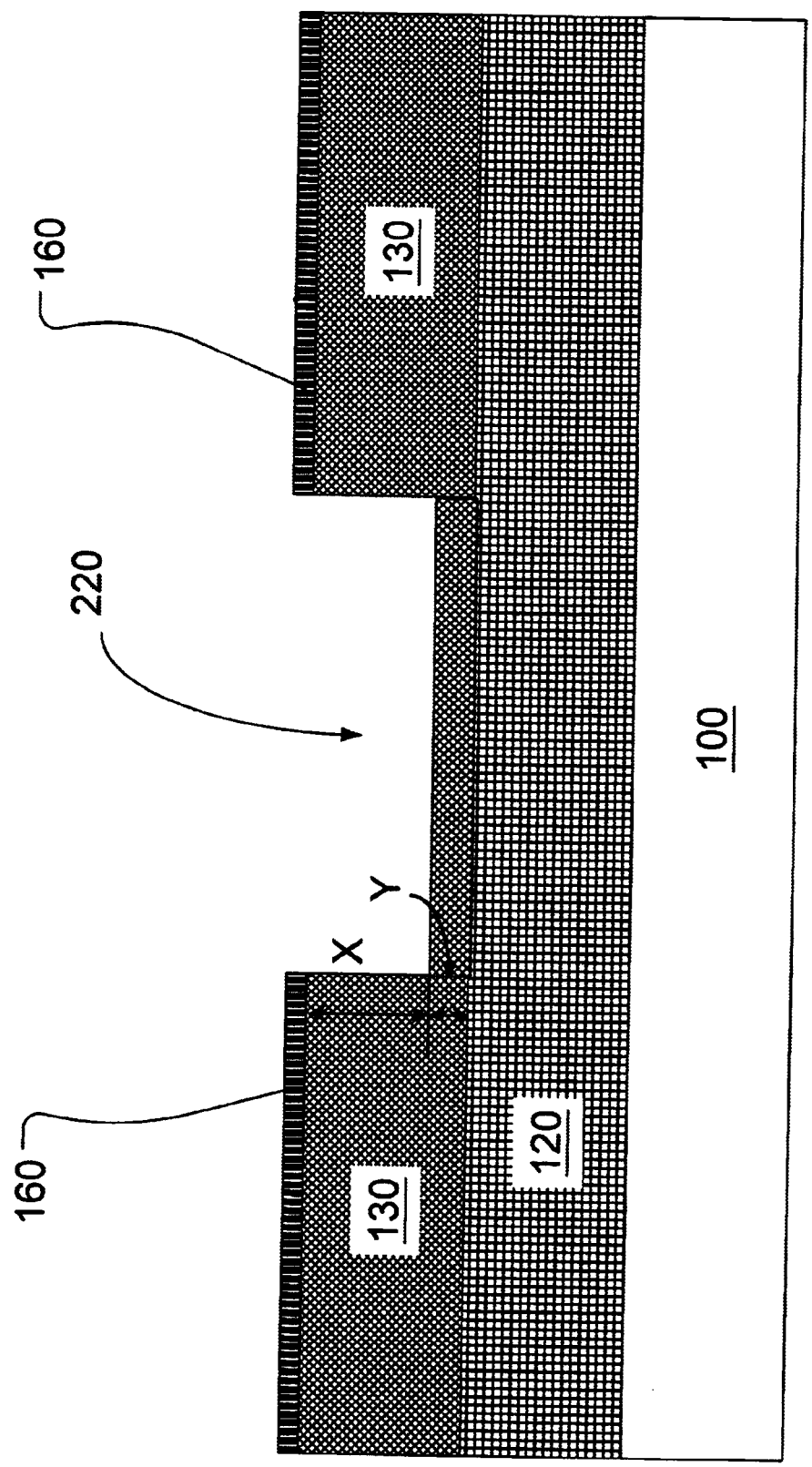

Referring to FIG. 3, after the anisotropic etching process is performed to define the etched region 220, the patterned photomask 150 (FIGS. 1–2) is stripped off, by ashing, for example. Alternatively, the patterned photomask 150 may be stripped using a 1:1 solution of sulfuric acid ($H_2SO_4$) to hydrogen peroxide ($H_2O_2$), for example. Because the dielectric layer 120 is covered by the thickness "Y" of the cap layer 130 in the etched region 220, the dielectric layer 120 will not be contaminated or damaged by the process used to remove the photoresist layer 150, by ashing, for example. As is evident from FIG. 3, the pattern from the photoresist mask has been transferred to the cap layer 130. This patterned cap layer 130 will then serve as a mask for transferring the pattern to the underlying process layer 120.

Figure 4:
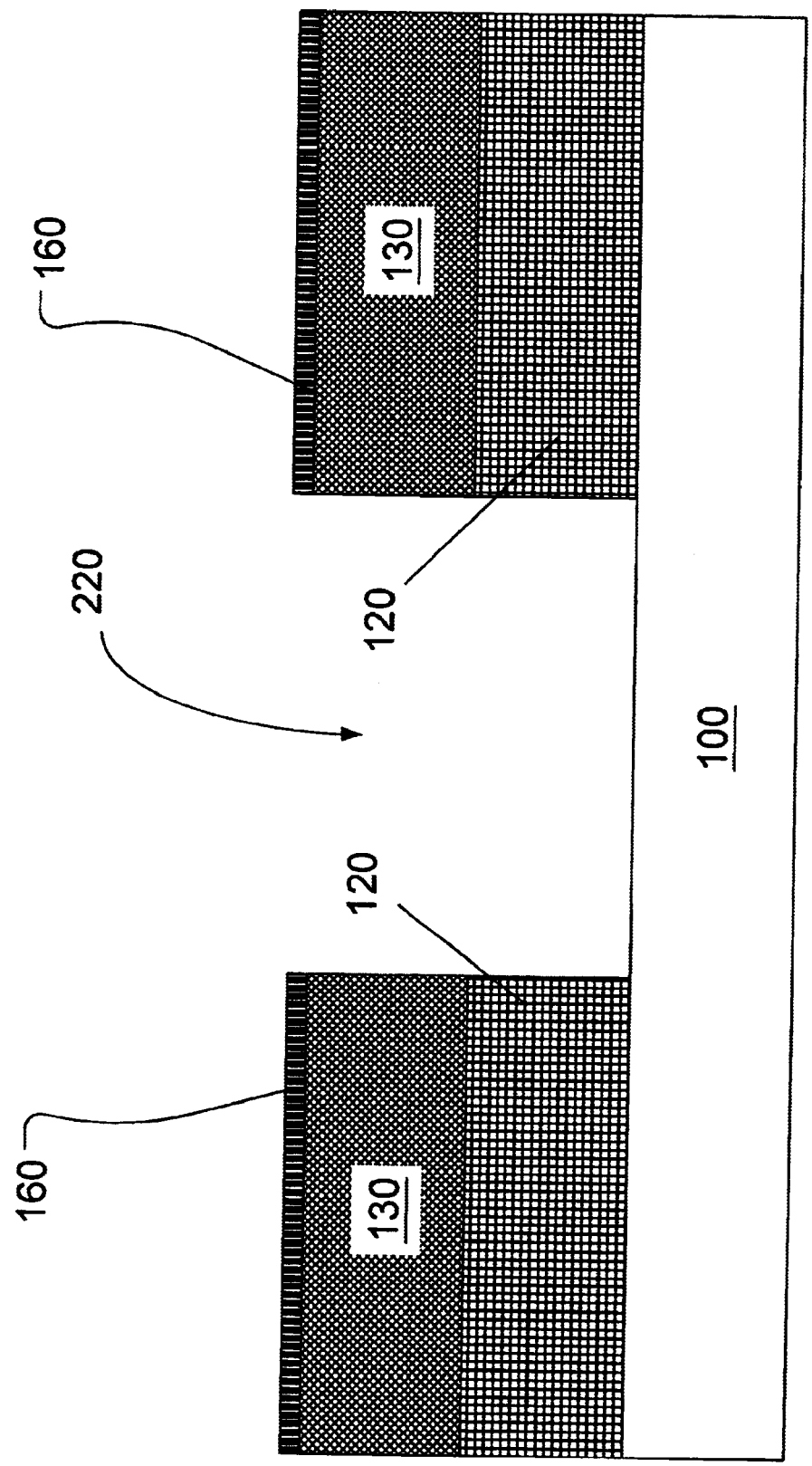

Referring now to FIG. 4, following removal of the patterned photoresist layer 150 (see FIGS. 1 and 2), a subsequent anisotropic etching process is performed. This subsequent anisotropic etching process will remove any remaining portion of the cap layer 130 underlying the etched region 220 and will anisotropically etch the process layer 120 underlying the etched region 220. Any suitable anisotropic etching process may be employed, including, for example, an $Ar/O_2$ process or a $CHF_3$ process.

This subsequent anisotropic etching process may be selected such that the ARC layer 160 and all, or a substantial part, of the cap layer 130 underlying the ARC layer 160 will be removed. For example, a $CHF_3$ process will etch the ARC layer 160 and all or substantially all of the cap layer 130 while simultaneously etching the process layer 120 underlying the etched region 220. In particular, the initial thickness of the ARC layer 160 and the cap layer 130 may be chosen such that all or substantially all of both layers 130, 160 will be removed during this second anisotropic etching process. Alternatively, the thicknesses of the ARC layer 160 and the cap layer 130 may be selected and the anisotropic etching process may be selected such that all or substantially all of the ARC layer 160 and all or substantially all of the cap layer 130 will remain following this subsequent anisotropic etching process. For example, a $CHF_3$ process can etch the remaining portion of the cap layer 130 underlying the etched region 220, as well as etch the process layer 120 underlying the etched region 220 without removing a substantial portion of the ARC layer 160 and/or the cap layer 130 underlying the ARC layer 160. The thicknesses of the ARC layer 160 and the cap layer 130 may be chosen, in view of the etch selectivity of the second anisotropic etching process with regard to the process layer 120, such that the desired portion of the cap layer 130 and/or the ARC layer 160 will remain following the second anisotropic etching process.

Figure 5:
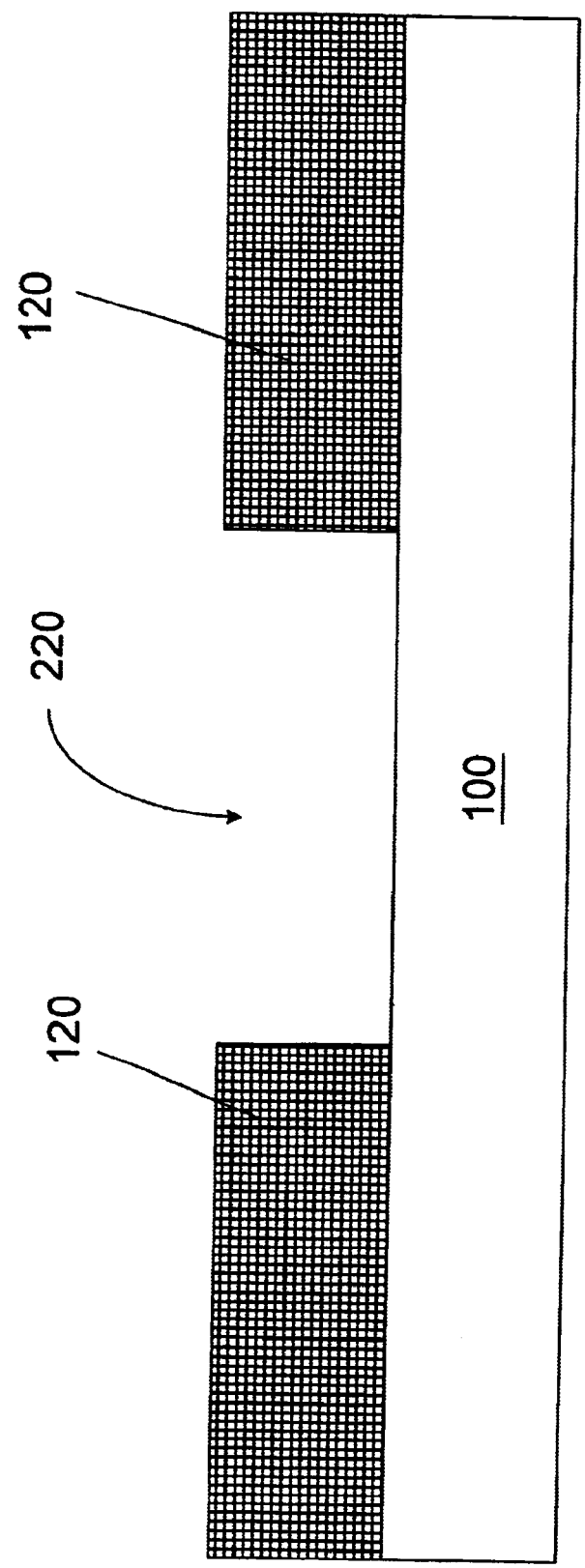
Figure 6:
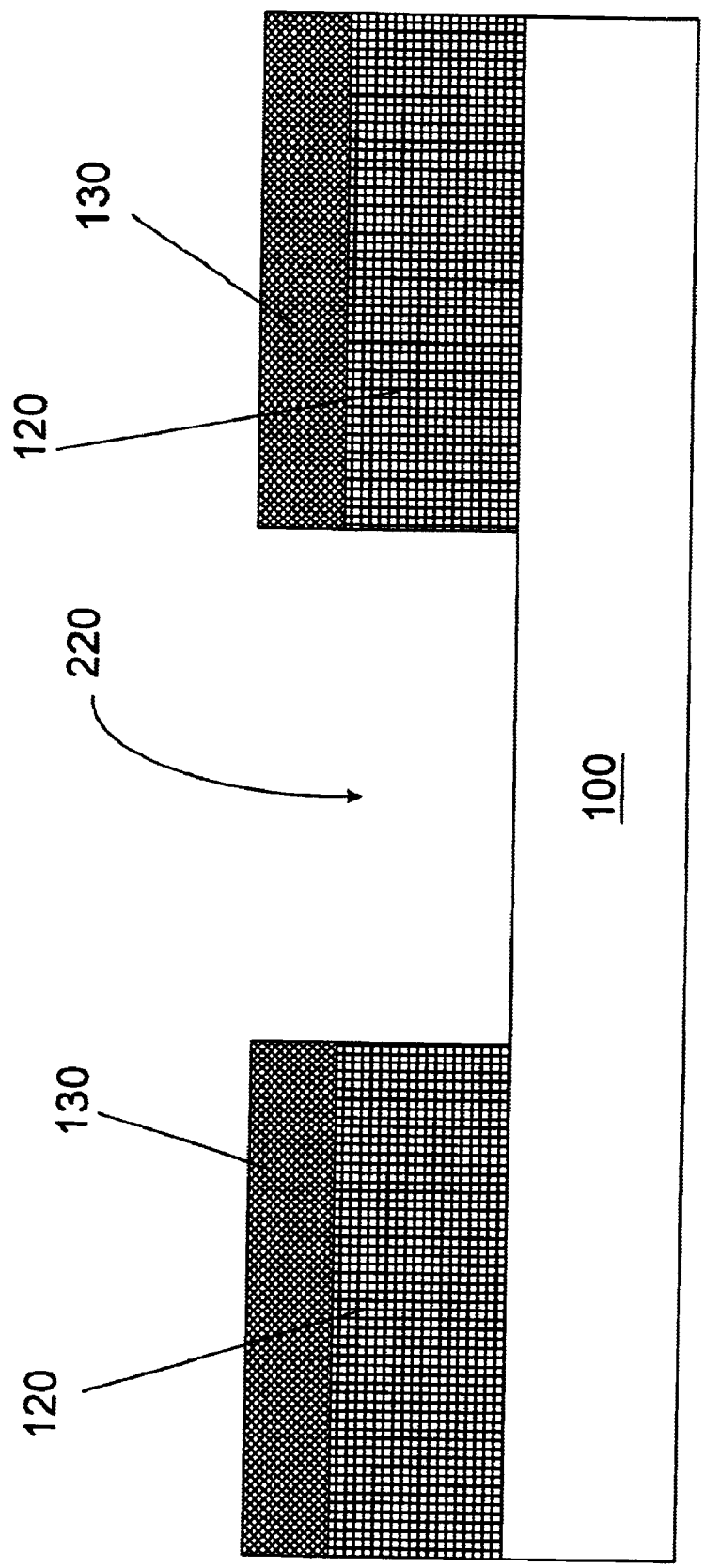

FIG. 4 illustrates the result of using an anisotropic etching process wherein all or substantially all of the ARC layer 160, as well as the underlying cap layer 130, remains following the subsequent anisotropic etching process, FIG. 5 illustrates the result of using an anisotropic etching process wherein all or substantially all of the ARC layer 160 and all or substantially all of the cap layer 130 is removed by the subsequent anisotropic etching process. FIG. 6 illustrates the result of using an anisotropic etching process that removes substantially all of the ARC layer 160 and a portion of, but not all of, the cap layer 130 underlying the ARC layer 160. That is, the cap layer 130 is "thinned" during this anisotropic etching process, but a portion of the cap layer 130 remains. As will be appreciated by the person of ordinary skill in the art having the benefit of this disclosure, a variety of configurations may be formed by appropriate selection of the anisotropic etching process. Following the subsequent anisotropic etching process, a post-etch clean may be performed.

Figure 7:
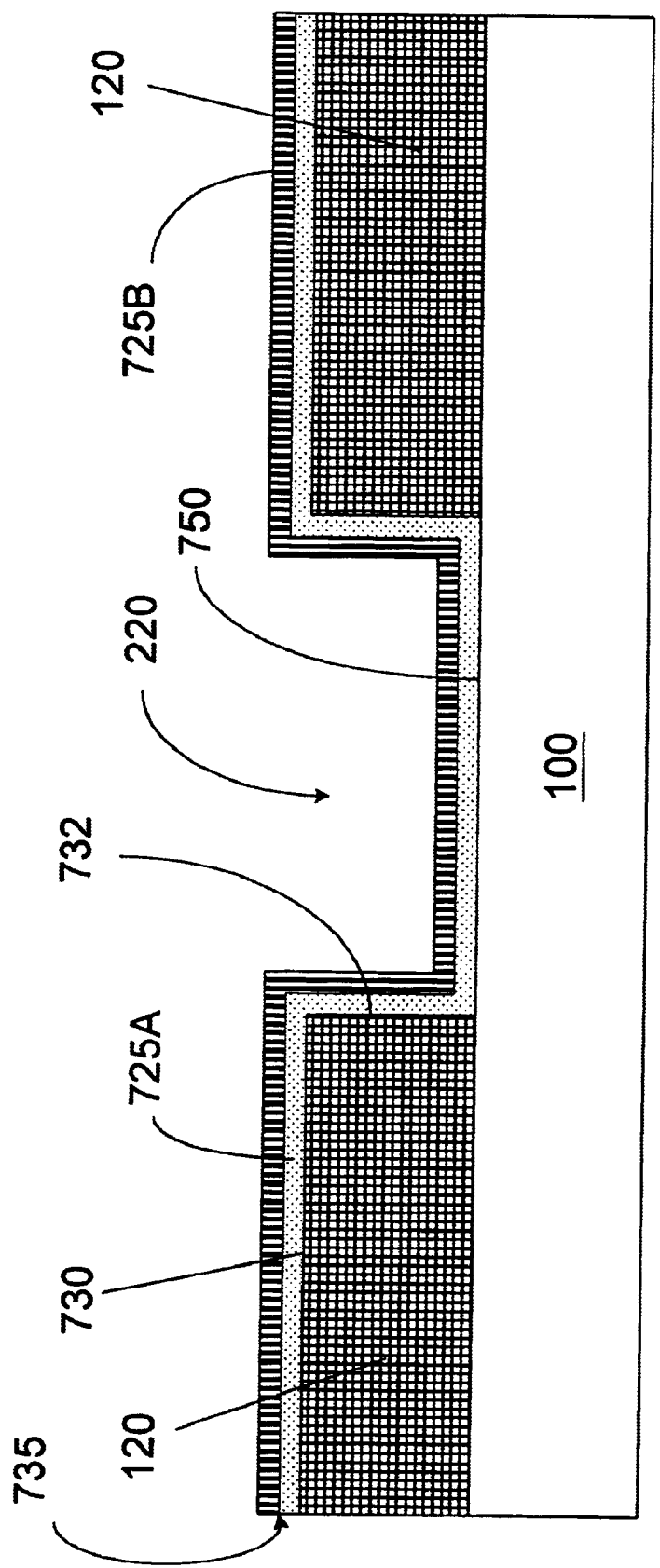

As shown in FIG. 7, a thin barrier metal layer 725A and a copper seed layer 725B (or a seed layer of another conductive material) are applied to the entire surface using vapor-phase deposition. The barrier metal layer 725A and the copper (Cu) seed layer 725B blanket-deposit an entire upper surface 730 of the process layer 120 as well as the side surfaces 732 and a bottom surface 750 of the etched region 220, forming a conductive surface 735, as shown in FIG. 7. If, following the above-described subsequent anisotropic etching process, all or a portion of the ARC layer 160 and/or the cap layer 130 remain, the barrier metal layer 725A and the copper seed layer 725B will overlay those remaining portions.

The barrier metal layer 725A may be formed of at least one layer of a barrier metal material, such as tantalum (Ta) or tantalum nitride (TaN), and the like, or, alternatively, the barrier metal layer 725A may be formed of multiple layers of such barrier metal materials. For example, the barrier metal layer 725A may also be formed of titanium nitride (TiN), titanium-tungsten, nitrided titanium-tungsten, magnesium, a sandwich barrier metal Ta/TaN/Ta material, or another suitable barrier material. Tantalum nitride (TaN) is believed to be a good diffusion barrier to copper (Cu). Tantalum (Ta) is believed to be easier to deposit than tantalum nitride (TaN), while tantalum nitride (TaN) is easier to subject to a chemical mechanical polishing (CMP) process than tantalum (Ta). The copper seed layer 725B may be formed on top of the one or more barrier metal layers 725A by physical vapor deposition (PVD) or chemical vapor deposition (CVD), for example.

The bulk of the copper trench-fill is frequently done using an electroplating technique, where the conductive surface 735 is mechanically clamped to an electrode (not shown) to establish an electrical contact, and the structure layer 100 and overlying layers are then immersed in an electrolyte solution containing copper (Cu) ions. An electrical current is then passed through the workpiece-electrolyte system to cause reduction and deposition of copper (Cu) on the conductive surface 735. In addition, an alternating-current bias of the workpiece-electrolyte system has been considered as a method of self-planarizing the deposited copper (Cu) film, similar to the deposit-etch cycling used in high-density plasma (HDP) tetraethyl orthosilicate (TEOS) dielectric depositions.

Figure 8:
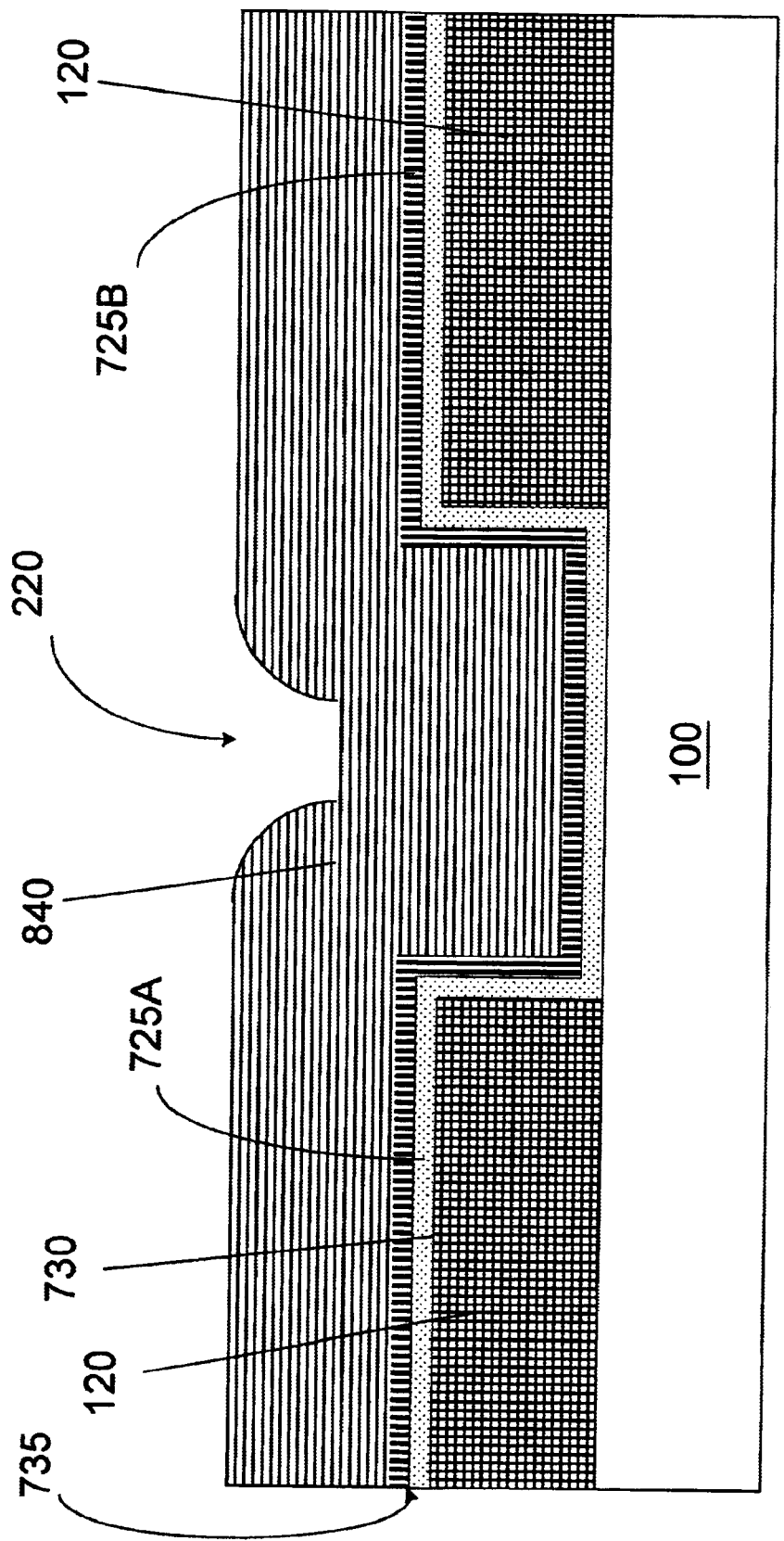

As shown in FIG. 8, this process typically produces a conformal coating of a copper (Cu) layer 840 of substantially constant thickness across the entire conductive surface 735. The copper (Cu) layer 840 may then be annealed using a rapid thermal anneal (RTA) process. For example, the copper (Cu) layer 840 may be annealed using an RTA process performed at a temperature ranging from approximately 100–400° C. for a time ranging from approximately 10–180 seconds. Alternatively, the copper (Cu) layer 840 may be annealed using a furnace anneal process at a temperature ranging from approximately 100–400° C. for a time ranging from approximately 10–90 minutes. In various alternative embodiments, the copper (Cu) layer 840 may be annealed using a rapid thermal anneal (RTA) process performed at a temperature ranging from approximately 250–350° C. for a time ranging from approximately 10–180 seconds. In still other various illustrative embodiments, the copper (Cu) layer 840 may be annealed using a furnace anneal process at a temperature ranging from approximately 250–350° C. for a time ranging from approximately 10–90 minutes. The use of an anneal process and/or the conditions under which it may be performed should not be considered a necessary feature of the present invention unless specifically set forth in the appended claims.

Figure 9:
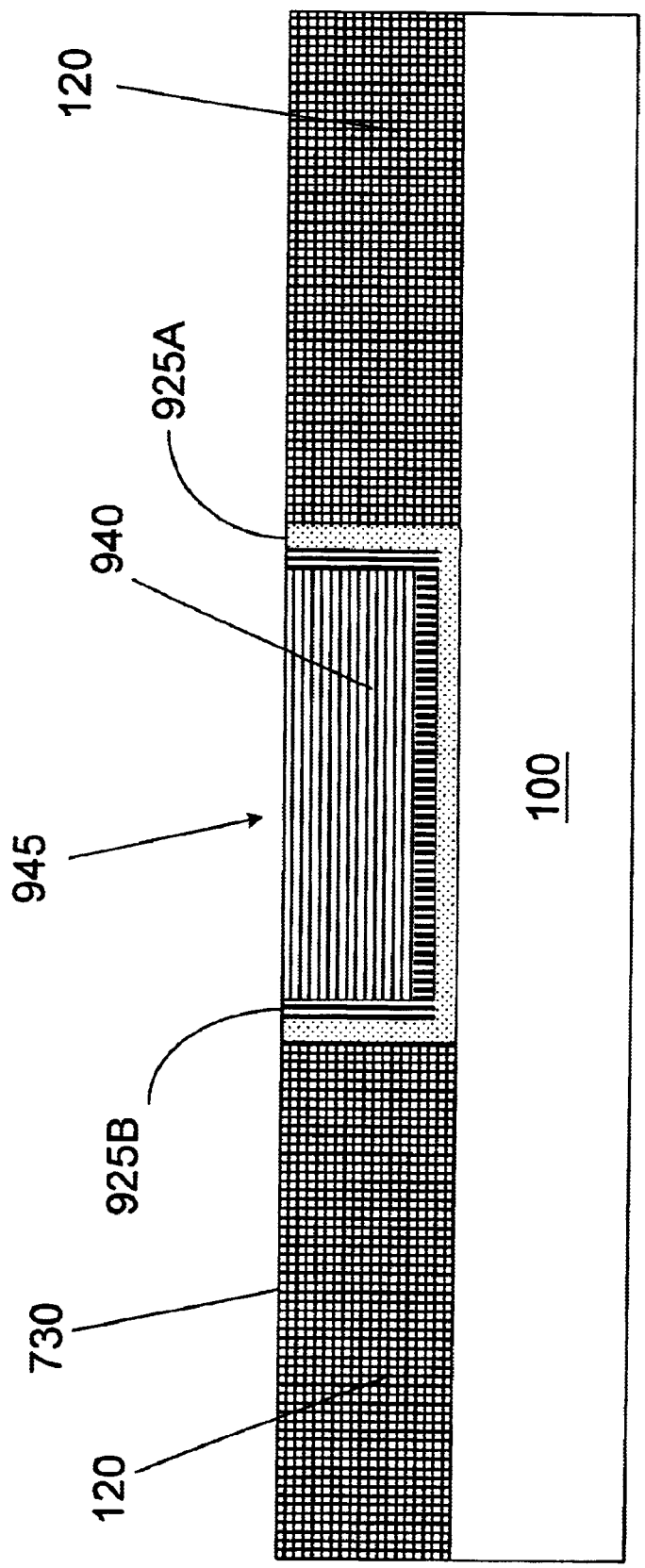

As shown in FIG. 9, following the post-deposition anneal described above, the copper (Cu) layer 840 is planarized using chemical mechanical polishing (CMP) techniques. The planarization using CMP clears copper (Cu) and barrier metal from the entire upper surface 730 of the process layer 120, leaving a copper (Cu) portion 940 of the copper (Cu) layer 840 remaining to form a copper (Cu) interconnect 945, adjacent remaining portions 925A and 925B of the one or more barrier metal layers 725A and copper seed layer 725B, respectively, as shown in FIG. 7. If any portion of the ARC layer 160 and/or the cap layer 130 remain following the second anisotropic etching process, those remaining portions may be removed during the CMP process, as desired.

Figure 10:
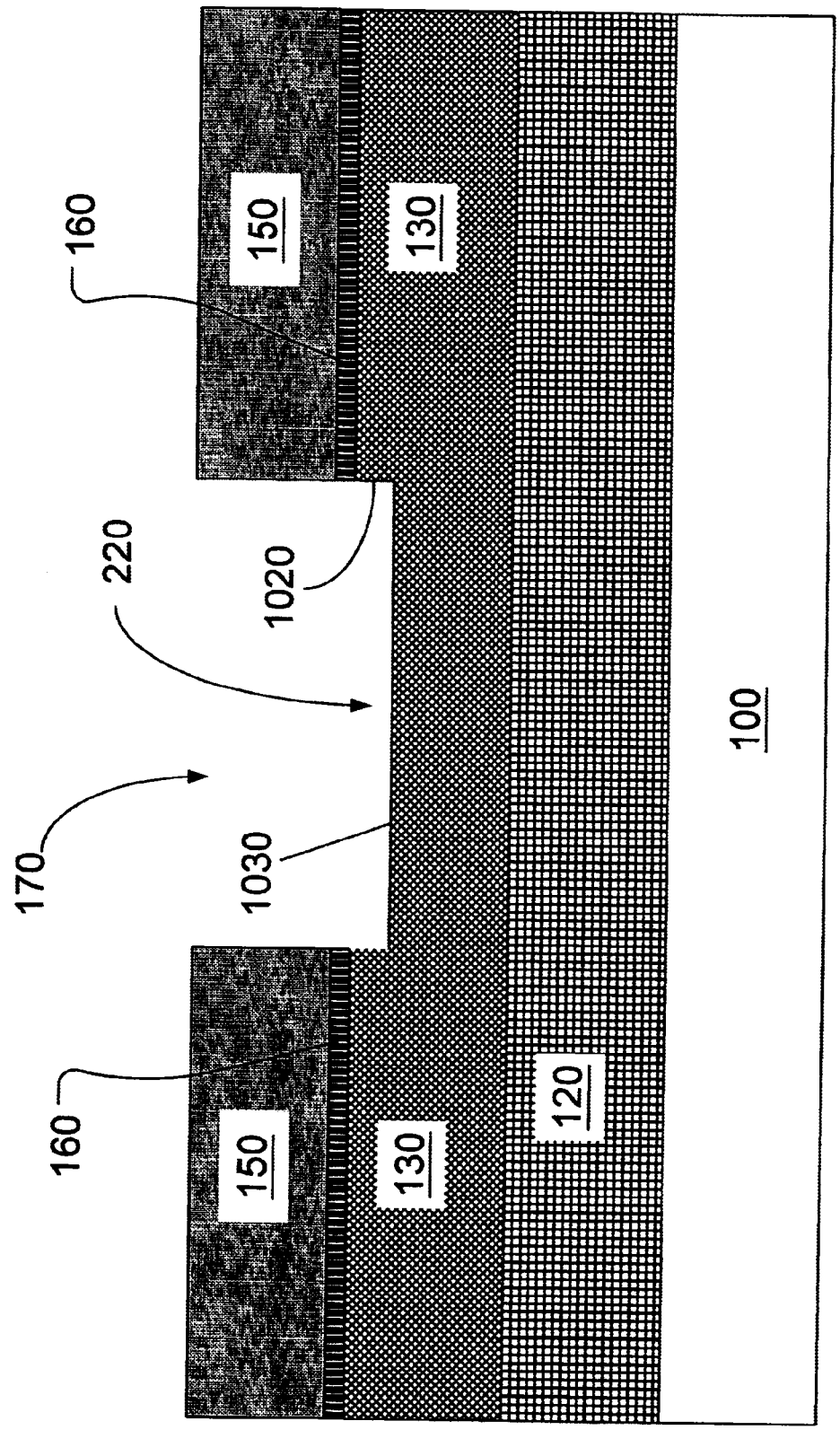
FIGS. 10–18 schematically illustrate a dual-damascene copper interconnect process flow according to various embodiments of the present invention.

FIGS. 10–18 schematically illustrate a dual-damascene copper interconnect process flow utilizing aspects of the present invention. FIG. 10 illustrates a structure layer 100 on which a first process layer 120 has been formed. The first process layer 120 may comprise a dielectric layer as described above in connection with FIGS. 1–9. Various materials that may be used to form the process layer 120 and the various ways in which it may be formed were described above. A cap layer 130 is formed above the first process layer 120, and the materials that may be used to form the cap layer 130 and the various ways in which it may be formed were described above in connection with FIGS. 1–9. An anti-reflective coating (ARC) layer 160 is formed above the cap layer 130 in the manner and using materials described above in connection with FIGS. 1–9. A layer of photoresist material 150 is formed above the ARC layer 160, and an opening 170 is formed in the layer of photoresist material 150 using well-known photolithography techniques.

An anisotropic etching process is performed through the opening 170 in the layer of photoresist material 150 to create an etched region 220. The etched region 220 extends through the ARC layer 160 and into the cap layer 130, as illustrated in FIG. 10. A single or multiple anisotropic etching processes may be utilized in forming the etched region 220, as appropriate. The depth to which the etched region 220 will extend into the cap layer 130 is a matter of design choice as described above in connection with FIG. 2. Generally, in the illustrative example shown in FIGS. 10–18, the initial anisotropic etching process to form the etched region 220 illustrated in FIG. 10 will leave a substantial portion of the cap layer 130 underlying the etched region 220. That is, in the embodiment illustrated in FIG. 10, the length of the sidewall 1020 into the cap layer 130 will typically be less than the distance "X," illustrated in the embodiment of FIG. 2. The etched region 220 will extend to a surface 1030 in the cap layer 130 of FIG. 10.

Following the first anisotropic etch to begin the etched region 220 in the cap layer 130, the layer of photoresist material 150 will be removed, for example, by ashing. Because the dielectric layer 120 remains covered by at least a portion of the cap layer 130, it is protected from contamination or damage that may occur during the ashing of the photoresist material 150.

Figure 11:
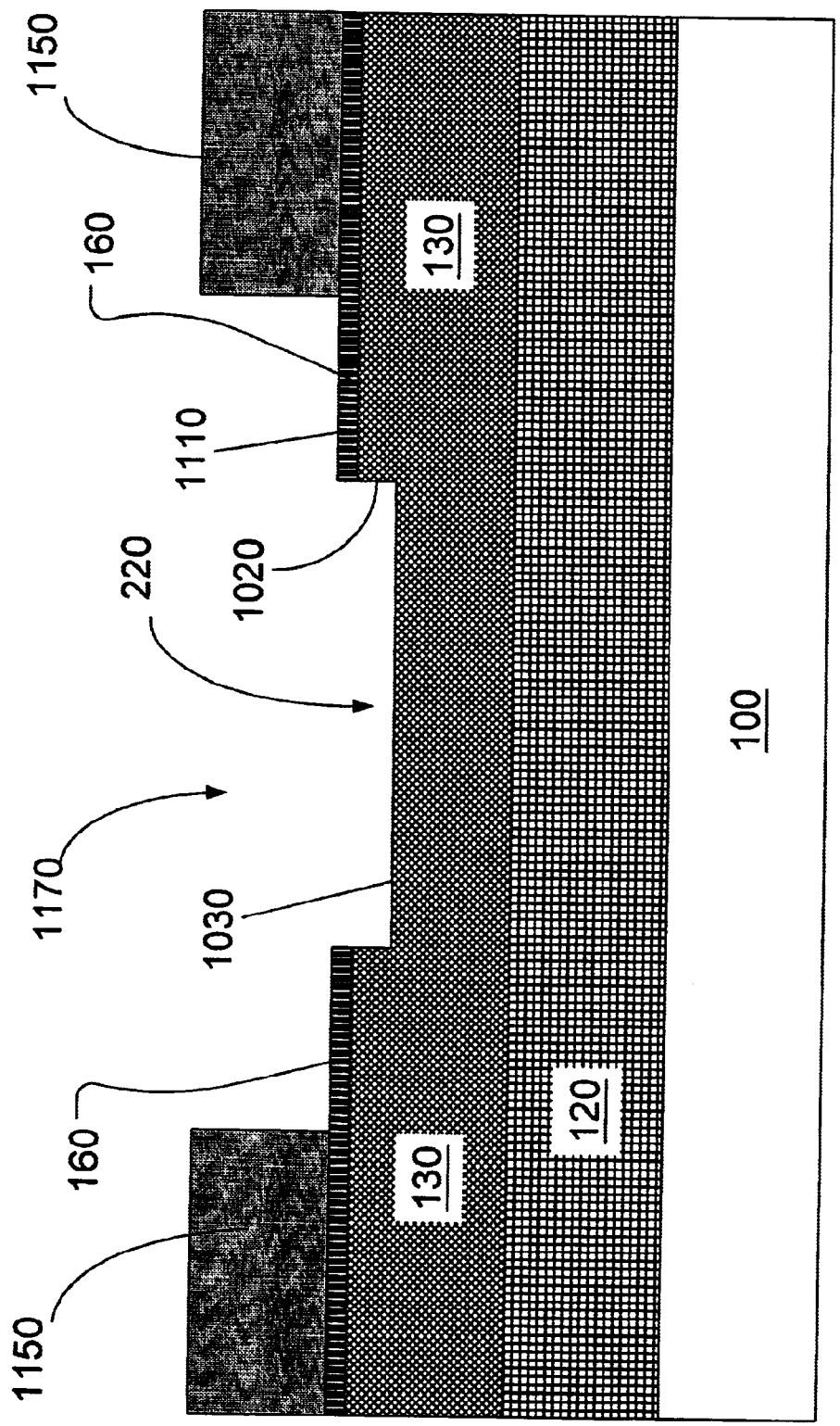

Referring now to FIG. 11, following removal of the layer of photoresist material (see FIG. 10), a second layer of photoresist material 1150 will be formed above the ARC layer 160. An opening 1170 will be formed in the layer of photoresist material 1150. The opening 1170 will be larger than the opening 170 illustrated in FIG. 10, leaving an upper surface 1110 of the ARC layer 160 exposed.

Figure 12:
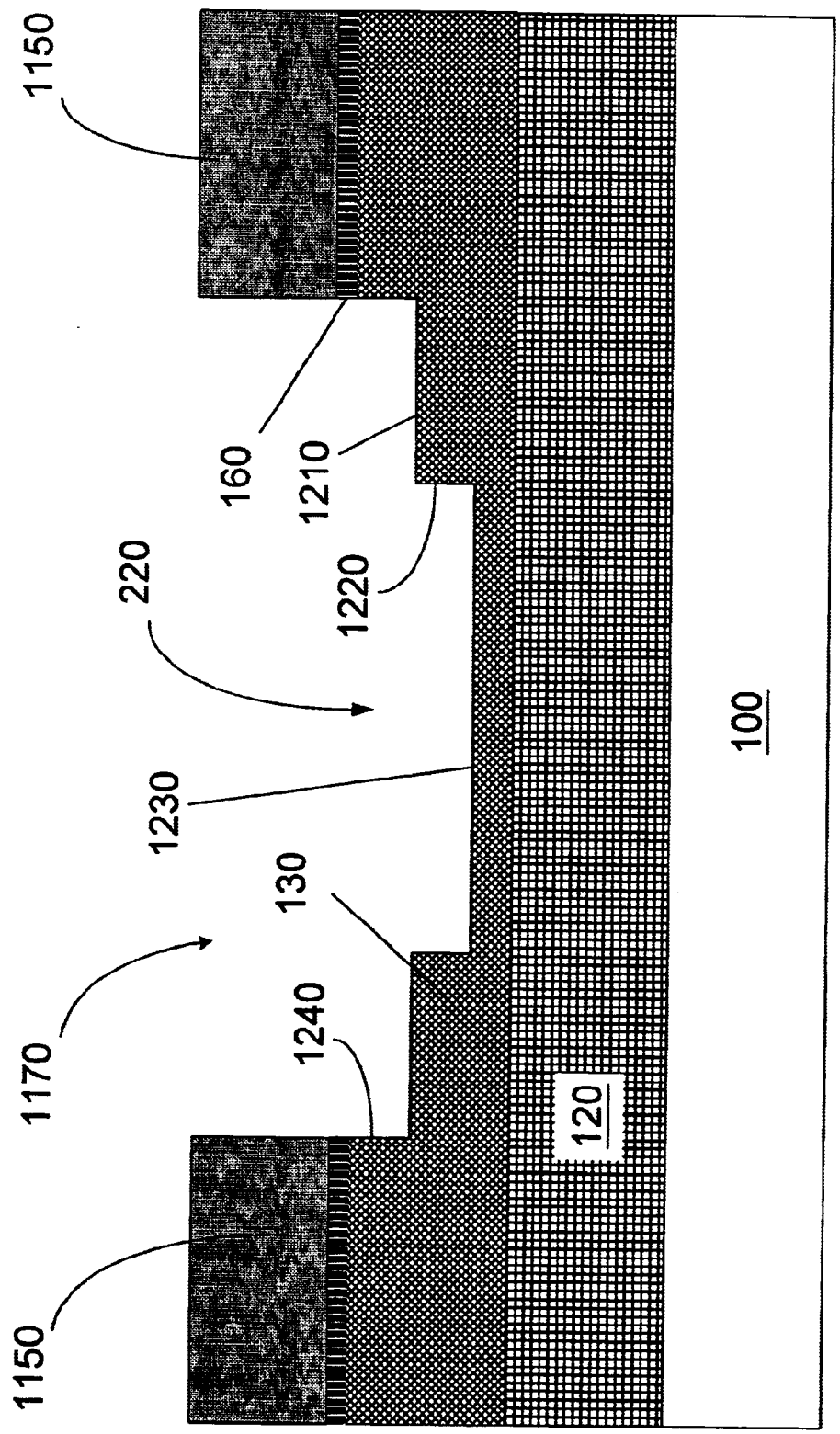

Referring now to FIG. 12, a second anisotropic etching process will be performed through the opening 1170 in the layer of photoresist material 1150. This anisotropic etching process will extend and enlarge the etched region 220 to include an additional portion of the ARC layer 160 and an enlarged area of the cap layer 130. After the second anisotropic etching process, the etched region 220 will extend to a surface 1230 in the cap layer 130 and to a surface 1210 in the cap layer 130. Sidewalls 1220 and 1240 will be formed in the cap layer 130. As in the case of the first anisotropic etching process, a single or multiple anisotropic etching processes may be utilized as the second anisotropic etching process to enlarge and extend the etched region 220. The depth to which the etched region 220 will extend into the cap layer 130 after the second anisotropic etching process is a matter of design choice. However, following the second anisotropic etching process (whether a single or multiple processes), at least a portion of the cap layer 130 will remain underlying the etched region 220 to protect the process layer 120 from exposure to any process conditions used to remove the photoresist layer 1150 and from any result of such removal.

Figure 13:
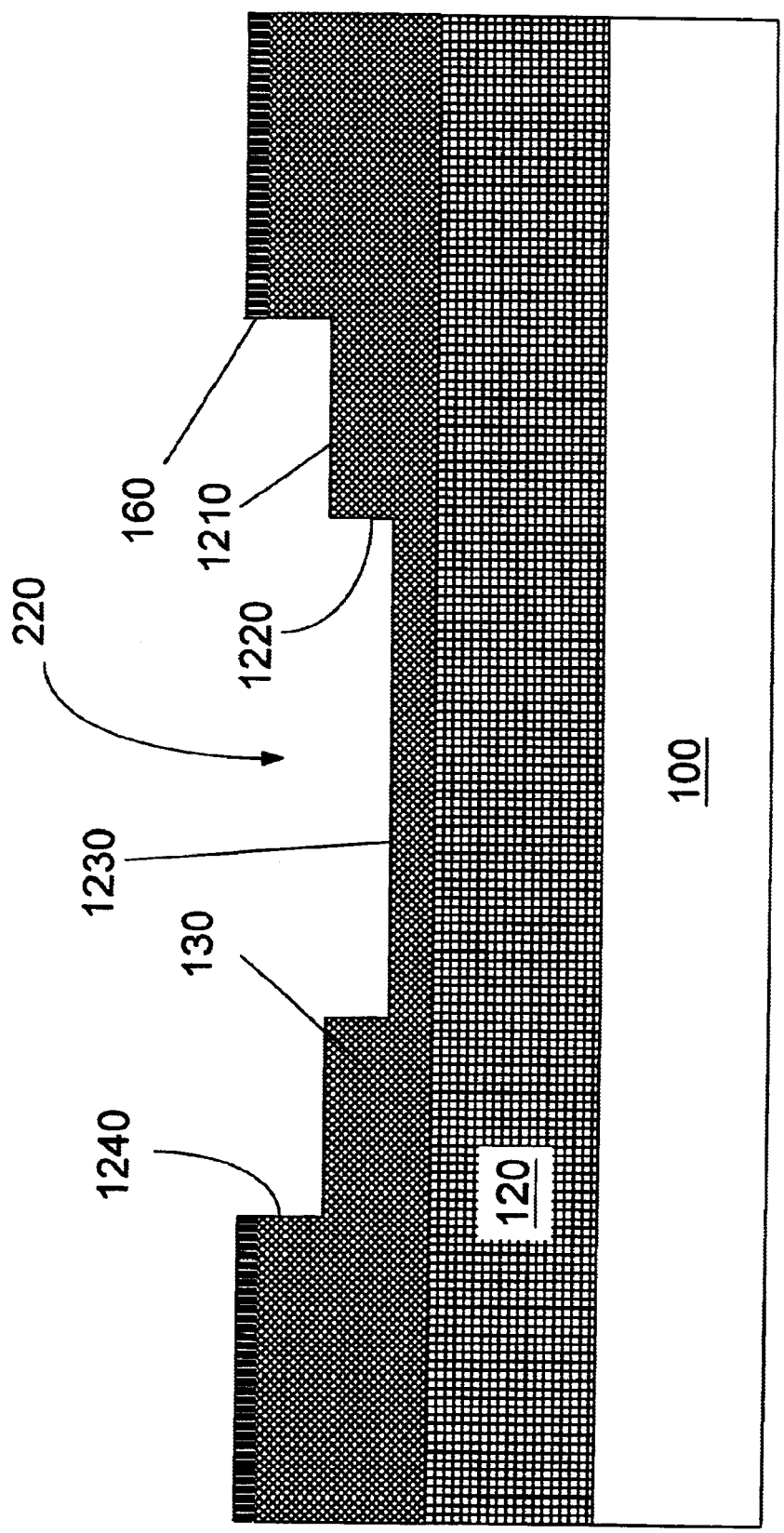

As illustrated in FIG. 13, following this second anisotropic etching process, the layer of photoresist material 1150 will be removed, for example, by ashing. Because the dielectric layer 120 remains protected by at least a portion of the cap layer 130, it will not be subject to contamination or damage due to any process used to remove the layer of photoresist material 1150. Following removal of the photoresist material 1150, a portion of the ARC layer 160 will remain and a step-wise pattern will have been formed in the cap layer 130.

Figure 14:
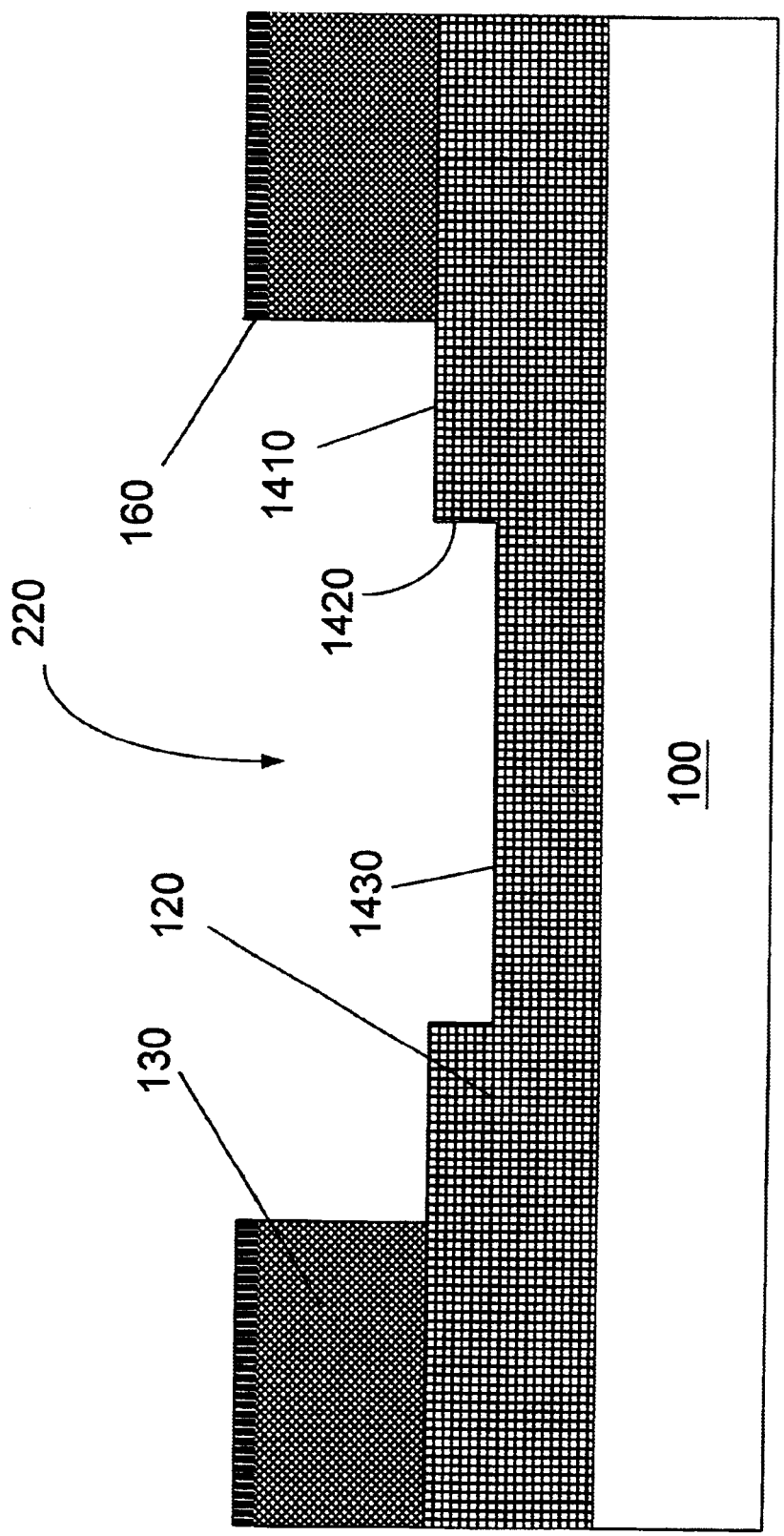
Figure 15:
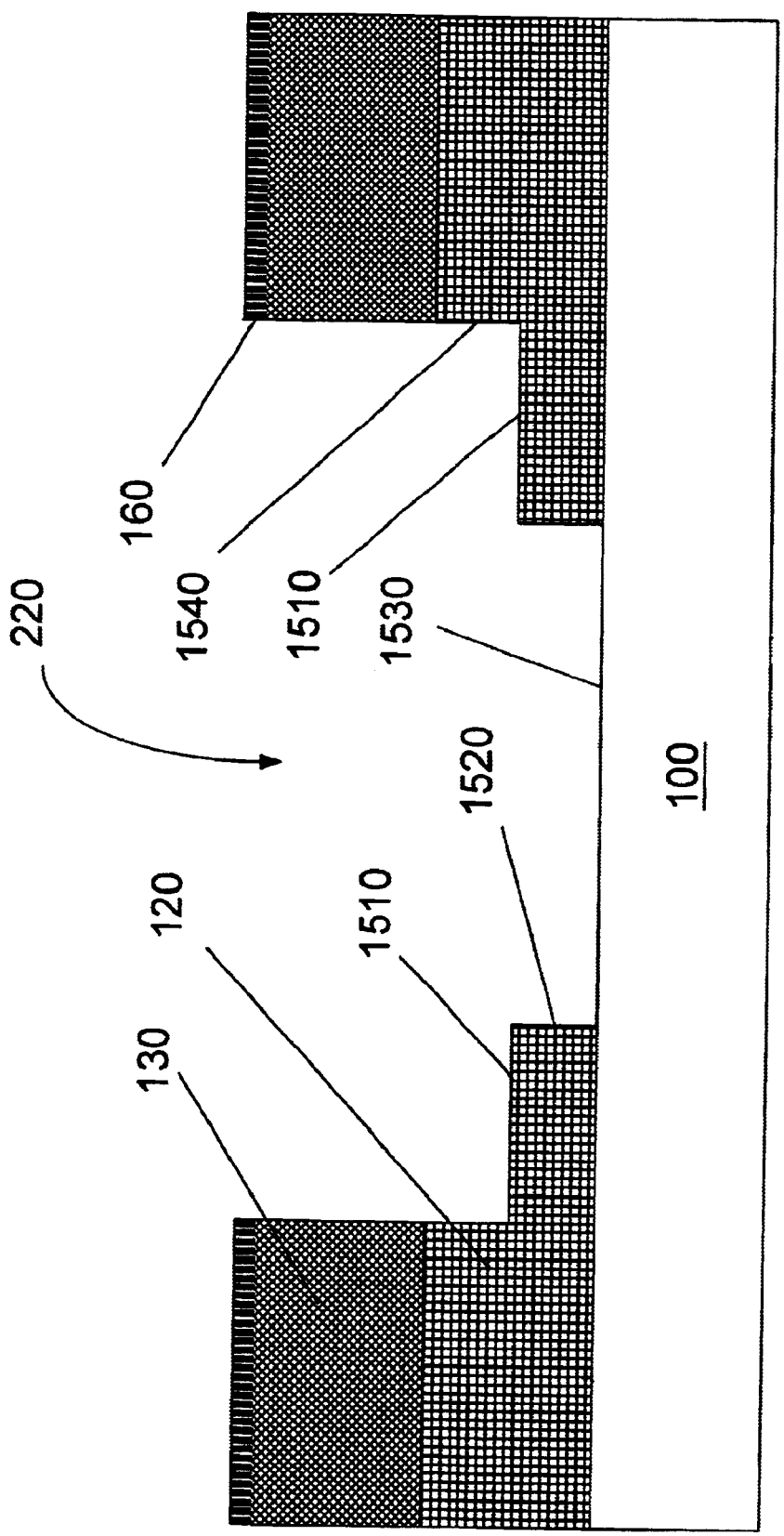

Following removal of the photoresist material 1150, a third anisotropic etching process will be performed. FIGS. 14 and 15 illustrate the progression and end result of one possible third anisotropic etching process. In the process illustrated in FIGS. 14 and 15, the anisotropic etching process will not substantially affect the ARC layer 160 and the portion of the cap layer 130 underlying that portion of the ARC layer 160. Rather, the anisotropic etching process will etch the exposed portion of the cap layer 130 as well as the underlying first process layer 120. That is, the step-wise pattern formed in the cap layer (see FIG. 13) will be extended through the cap layer 130 and into the first process layer 120. As illustrated in FIG. 15, one possible third anisotropic etching process will extend the etched region 220 to an upper surface 1530 of the structure layer 100. In addition, the anisotropic etching process will extend to surfaces 1510 within the first process layer 120, creating sidewalls 1520 and 1540 in the first process layer 120.

Figure 16:
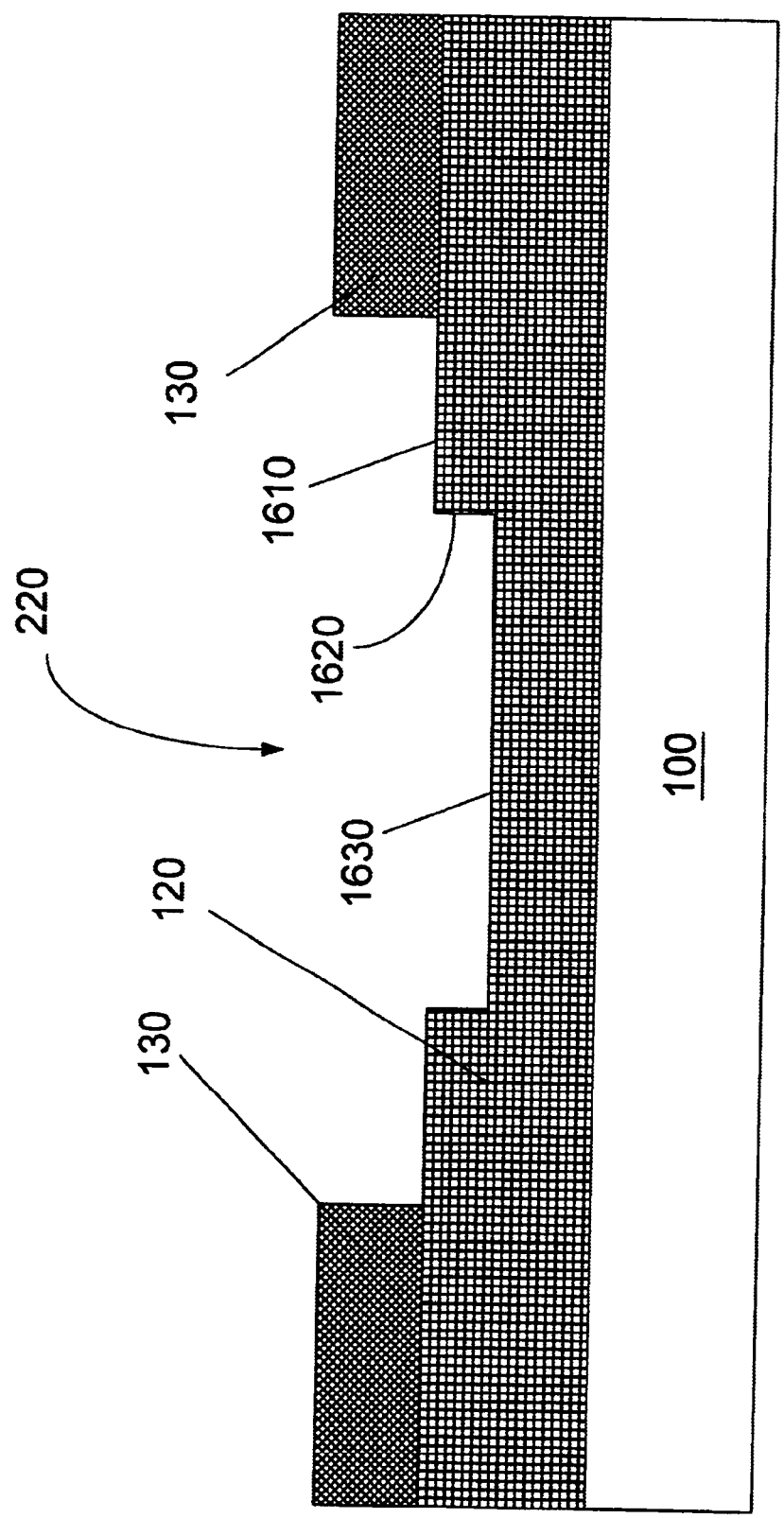
Figure 17:
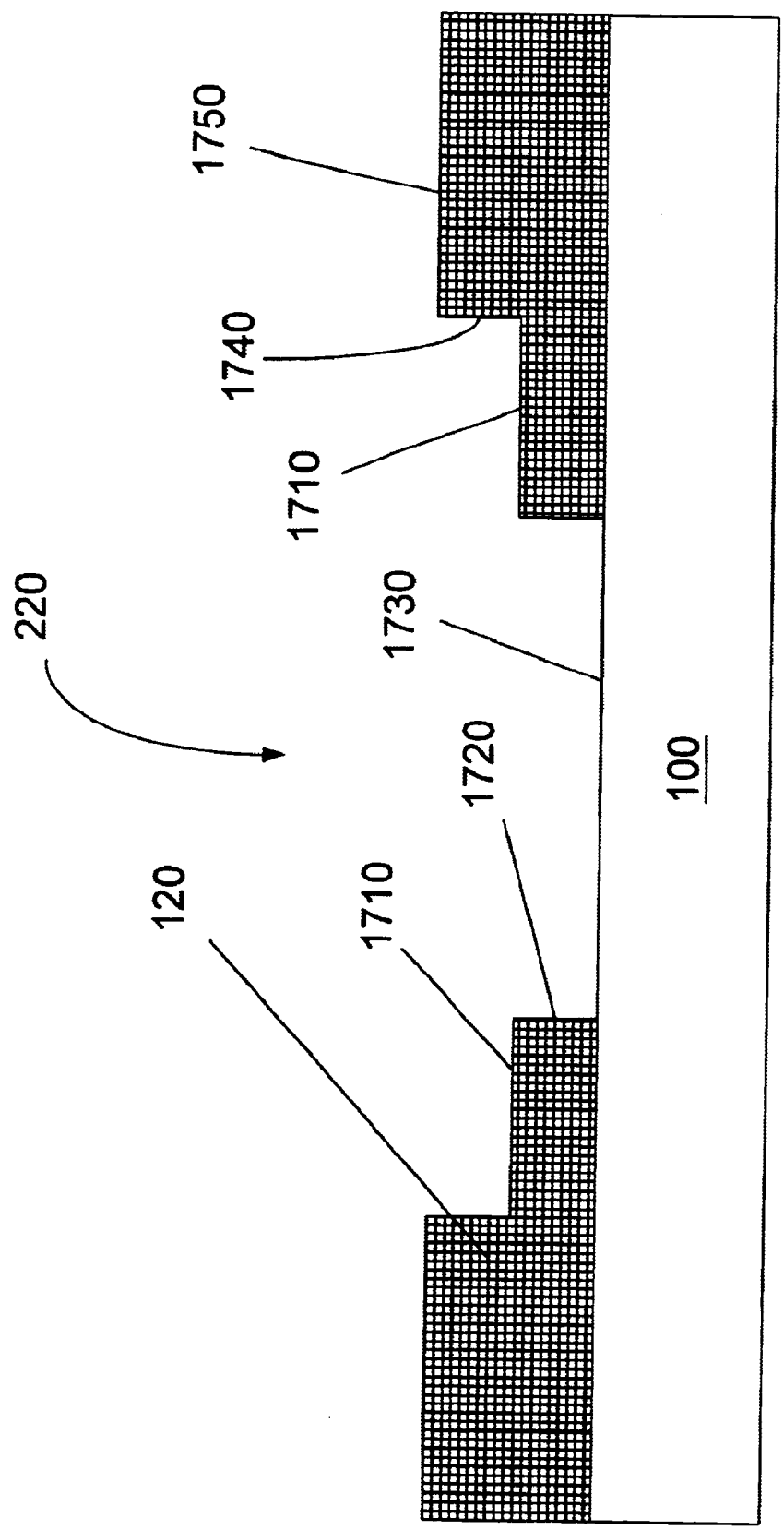

FIGS. 16 and 17 show another possibility for the progression and end result of the third anisotropic etching process. For example, the third anisotropic etching process may be selected such that it will etch away substantially all of the remaining portion of the ARC layer 160 and begin to etch into the underlying cap layer portion 130, as shown in FIG. 16. As illustrated in FIG. 17, this third anisotropic etching process may extend the etched region 220 to an upper surface 1730 of the structure layer 100 as well as to surfaces 1710 within the first process layer 120. Again, sidewalls 1720 and 1740 will be created in the first process layer 120. In this particular third anisotropic etching process, substantially all of the ARC layer 160 will have been completely removed and all or substantially all of the cap layer 130 will also have been removed, leaving an exposed upper surface 1750 of the first process layer 120. As discussed in connection with FIGS. 4–6 above, the thicknesses of the cap layer 130 and the ARC layer 160 may be selected, in view of the selectivity of the third anisotropic etching process, such that any desired thickness, if any, of the cap layer 130 and/or the ARC layer 160 will remain following the third anisotropic etching process.

Figure 18:
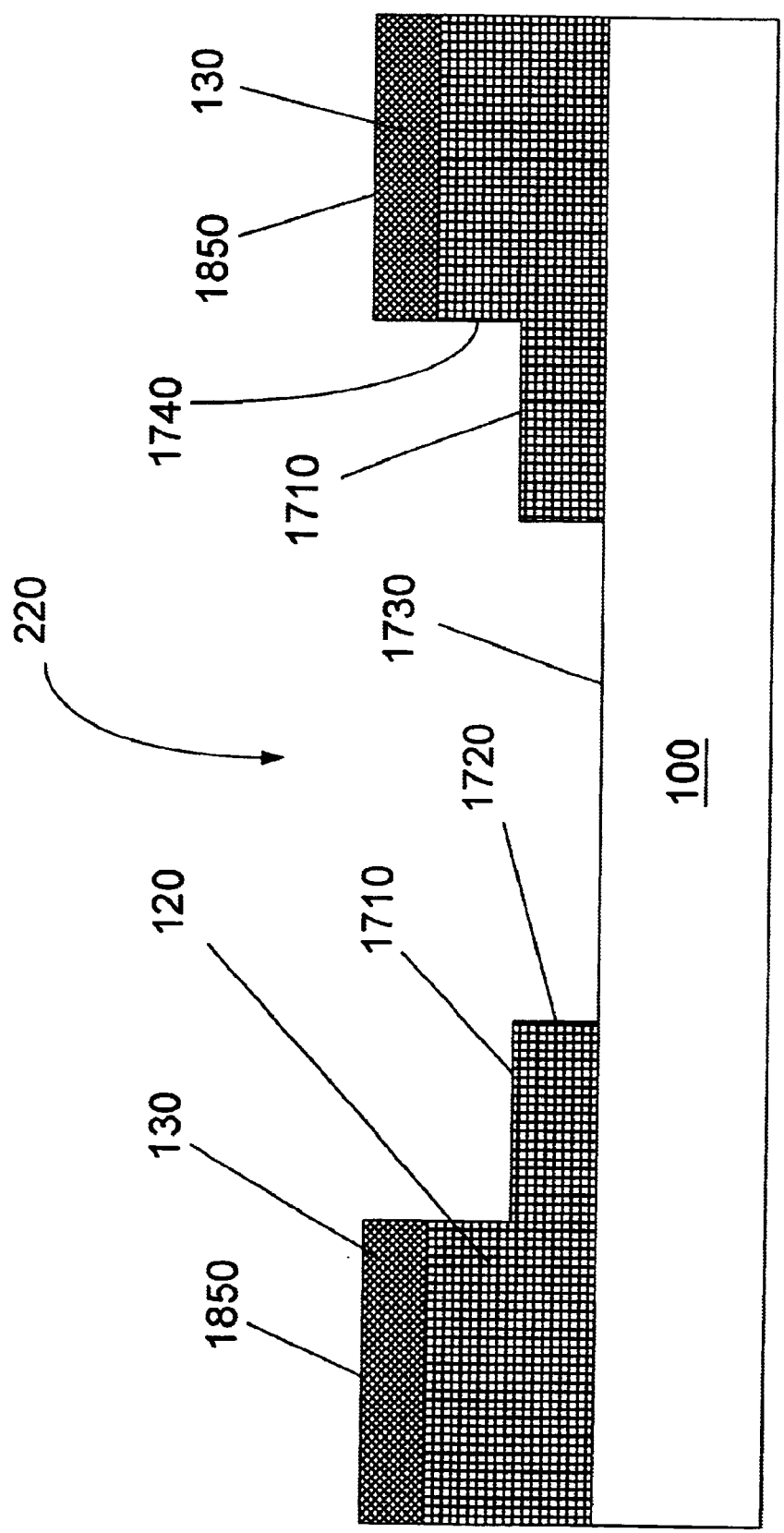

FIG. 18 illustrates an end result when yet another illustrative third anisotropic etching process has been selected. In the example of FIG. 18, the anisotropic etching process has been selected such that it will remove substantially all of the ARC layer 160 and a portion of the underlying cap layer 130. In this illustrative example, the cap layer 130 is "thinned" by the third anisotropic etching process, but it is not removed entirely. Rather, a portion of the cap layer 130 will remain. The etched region 220 will be extended to the upper surface 1730 of the structure layer 100 and to the surface 1710 within the process layer 120. Again, the sidewalls 1720 and 1740 will have been formed within the first process layer 120. This particular third anisotropic etching process will extend to create an upper surface 1850 within the cap layer 130. The extent to which the ARC layer 160 and the cap layer 130 are to remain or be removed during the third anisotropic etching process is a matter of design choice and, together with the thicknesses of the layers 130 and 160, will determine the particular process used for the third anisotropic etching process as well as the various parameters associated with such process, such as, duration and chemistry. Any portion of the ARC layer 160 and/or the cap layer 130 that remains after the third anisotropic etching process may be removed, if desired, by a CMP process performed later. Alternatively, those remaining portions may be removed by other suitable or desirable techniques.

Following the third anisotropic etching process, three possible results of which are illustrated in FIGS. 15, 17 and 18, a barrier layer will be deposited as described in connection with FIGS. 1–9. Following formation of the barrier layer, a conductive material will be deposited, as before. When the conductive material to be deposited is copper, a copper seed layer may first be formed above the barrier layer before an electroplating process is used to coat a layer of copper over the device. Following the deposition of the conductive material, the process may continue as described in connection with FIGS. 7–9.

Figure 19:
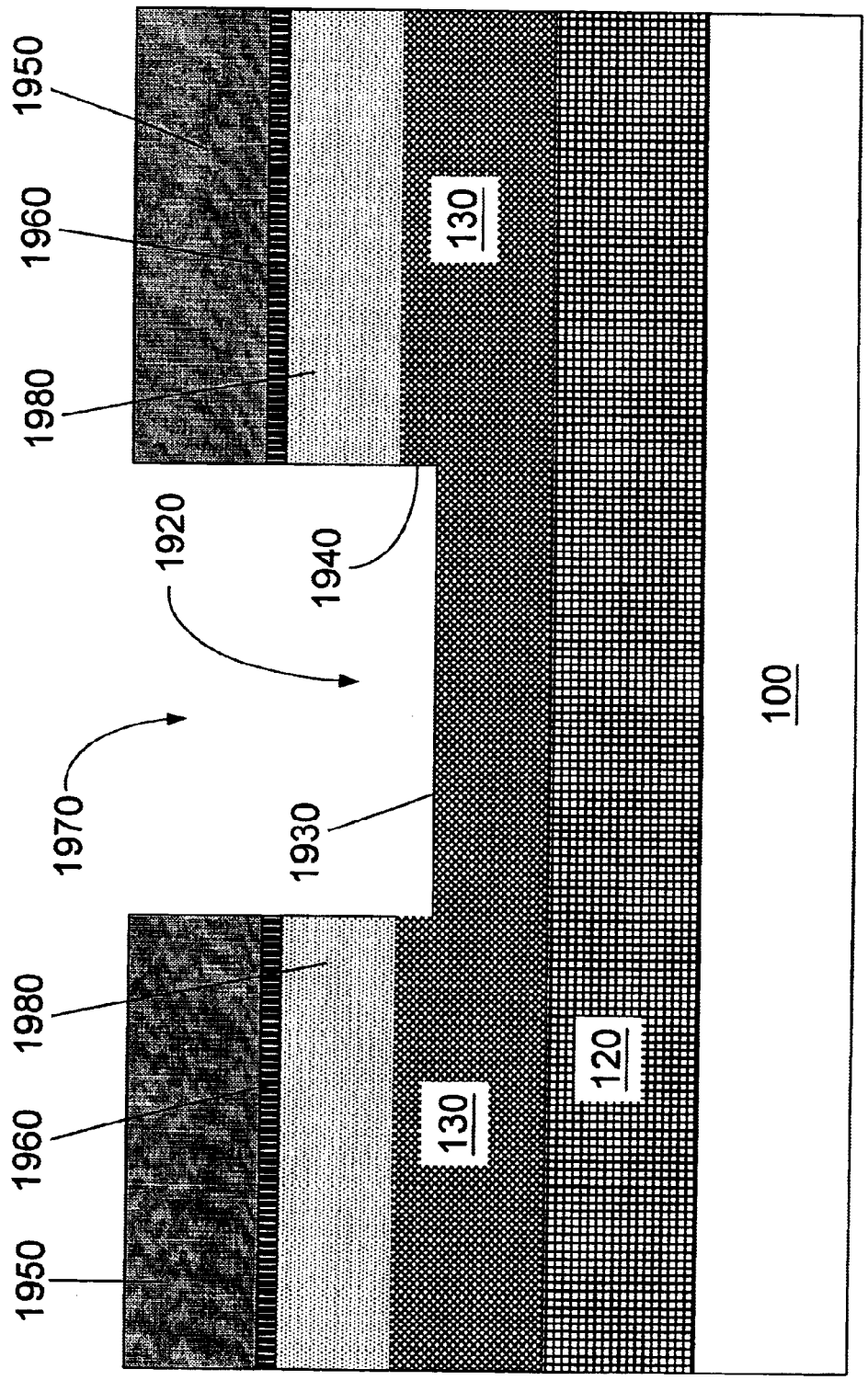
FIGS. 19–24 schematically illustrate another dual-damascene copper interconnect process flow according to various embodiments of the present invention.

FIGS. 19–24 schematically illustrate another dual-damascene copper interconnect process flow utilizing various aspects of the present invention. As shown in FIG. 19, a structure layer 100 has formed above it a first process layer 120, for example, a dielectric layer. A first cap layer 130 is formed above the first process layer 120, and a second cap layer 1980 is formed above the first cap layer 130. As will be appreciated by the person of ordinary skill in the art having benefit of this disclosure, the materials used to form the first cap layer 130 and the second cap layer 1980, as well as the thicknesses of the first cap layer 130 and the second cap layer 1980, will be chosen in view of etch selectivities, for examples. An ARC layer 1960 is formed above the second cap layer 1980, and a layer of photoresist material 1950 is formed above the ARC layer 1960. An opening 1970 is formed in the layer of photoresist material 1950 through which an anisotropic etching process will be performed.

A first anisotropic etching process will be performed through the opening 1970 in the layer of photoresist material 1950 to create an etched region 1920. The etched region 1920 will extend to a surface 1930 in the first cap layer 130, yielding a sidewall 1920 in the first cap layer 130. That is, in the embodiment illustrated in FIG. 19, the first anisotropic etching process will etch through the ARC layer 1960, through the second cap layer 1980, and into the first cap layer 130. Alternatively, although not depicted in FIG. 19, the first anisotropic etching process may etch through the ARC layer 1960 and into the second cap layer 1980, but need not extend into the first cap layer 130. In that circumstance, the etched region 1920 will extend into the second cap layer 1980 but will not extend into the first cap layer 130. The depth of the etched region 1920 following the first anisotropic etching process will be a matter of design choice, as will be appreciated by the person of ordinary skill in the art having the benefit of this disclosure.

Following the first anisotropic etching process, the layer of photoresist material 2950 will be removed, for example, by ashing or other suitable process. For example, the layer of photoresist material 1950 may be removed using conventional oxygen plasmas. Because the first process layer 120, for example, a dielectric layer, remains protected by at least a portion of the first cap layer 130, the first process layer 120 will not be subject to damage due to any process used to remove the layer of photoresist material 1950.

Figure 20:
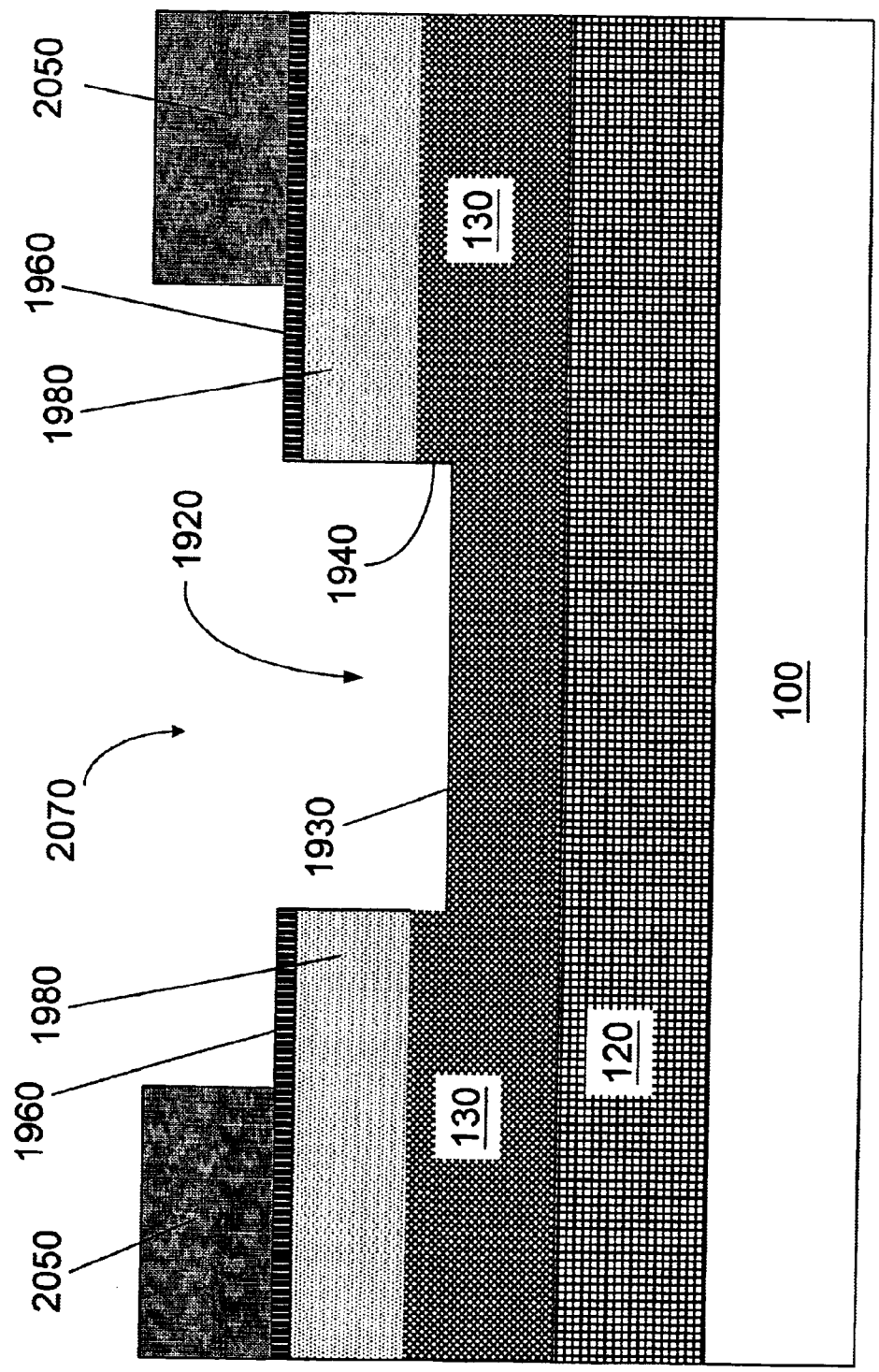

Following removal of the layer of photoresist material 1950, a second layer of photoresist material 2050 will be formed over the ARC layer 1960, as illustrated in FIG. 20. An opening 2070 will be created in the layer of photoresist material 2050 through which a second anisotropic etching process will be performed.

Figure 21:
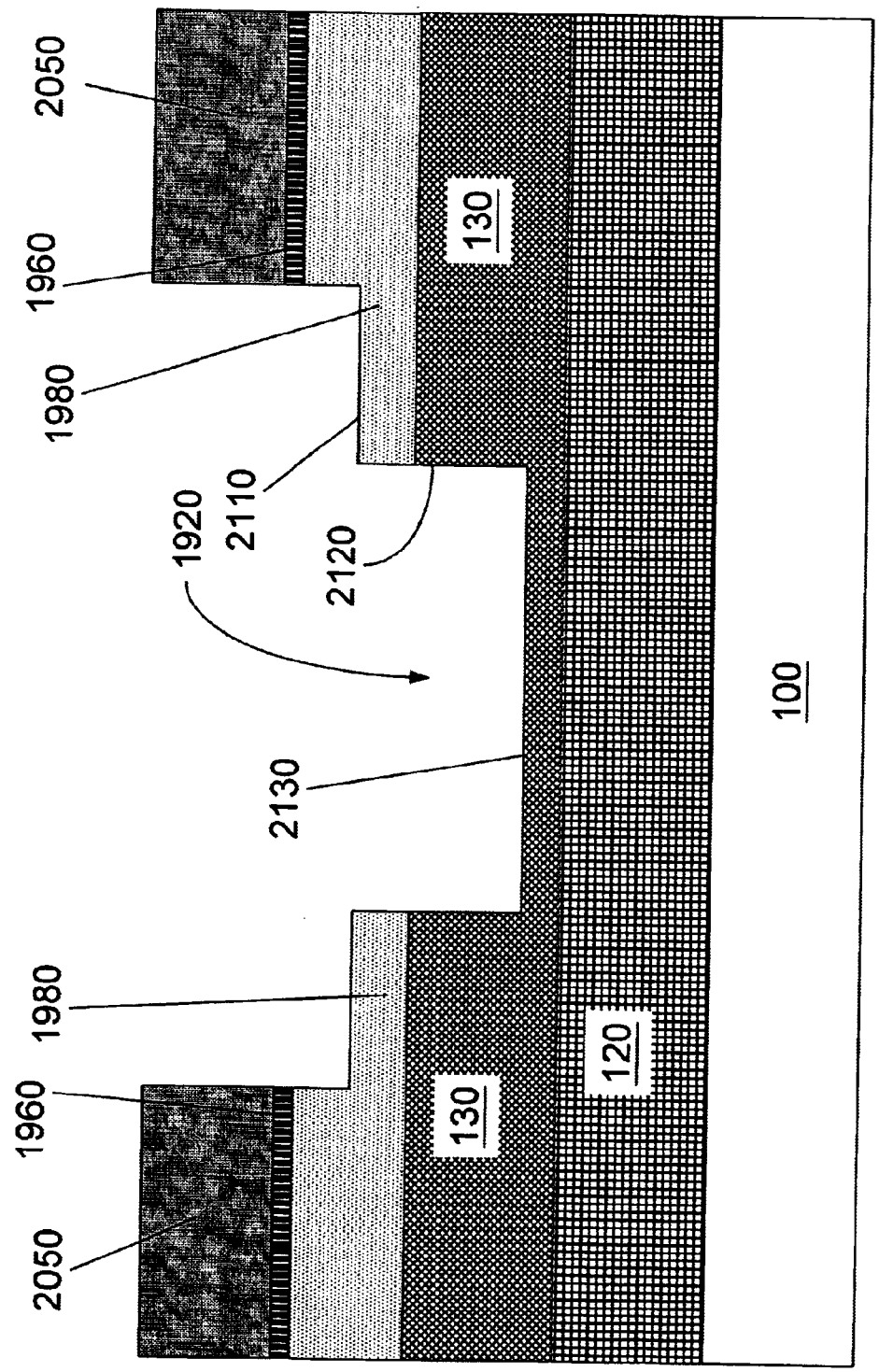

As illustrated in FIG. 21, the second anisotropic etching process will extend the etched region 1920 further into the first cap layer 130 to a surface 2130 in the first cap layer 130. In the circumstance where the first anisotropic etching process does not invade the first cap layer 130 (not illustrated), the second anisotropic etching process will extend the etched region 1920 through any remaining portion of the second cap layer 1980 and into the first cap layer 130, treating a sidewall 2120 in the first cap layer 130. The second anisotropic etching process will also etch that portion of the ARC layer 1960 (see FIG. 20) not underlying the layer of photoresist material 2050, and will etch at least a portion of the second cap layer 1980, as illustrated in FIG. 21. The second anisotropic etching process will extend to a surface 2110 within the second cap layer 1980.

Figure 22:
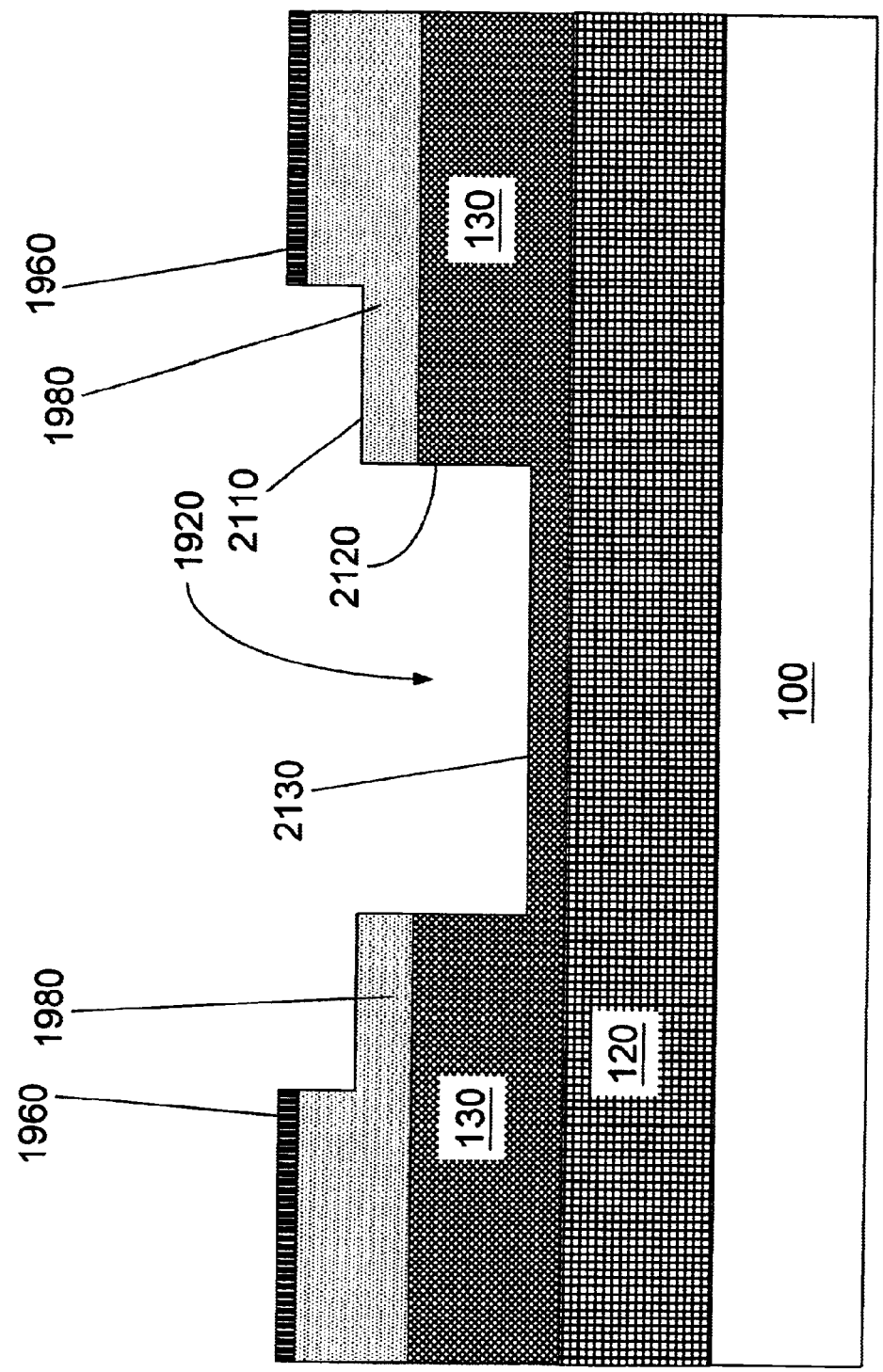

Following the second anisotropic etching process, the layer of photoresist material 2050 will be removed, for example, by ashing or other suitable process. Because the first process layer 120 remains covered by at least a portion of the first cap layer 130, the first process layer 120 will not be subject to damage that might otherwise be created by any process utilized to remove the layer of photoresist material 2050. FIG. 22 illustrates the structure following removal of the layer of photoresist material 2050.

Figure 23:
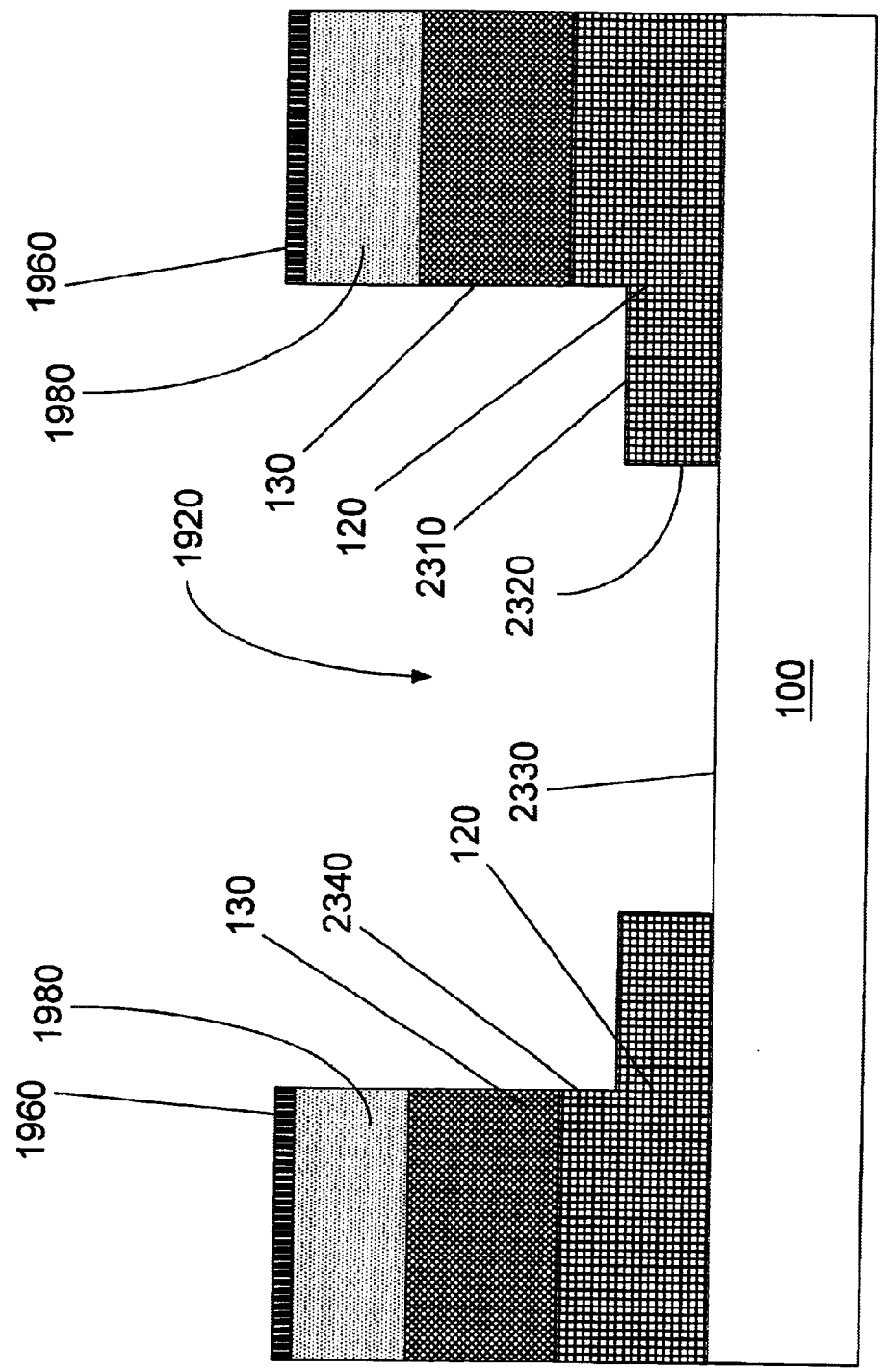

Following removal of the layer of photoresist material 2050, a third anisotropic etching process will be performed. As illustrated in FIG. 23, this third anisotropic etching process will extend the etched region 1920 to an upper surface 2330 of the structure layer 100. This third anisotropic etching process will also extend to a surface 2310 within the first process layer 120, creating sidewalls 2320 and 2340 within the first process layer 120. The sidewall 2340, in the illustration of FIG. 23, will extend from within the first process layer 120 upward through the first cap layer 130, the second cap layer 1980, and the ARC layer 1960.

Figure 24:
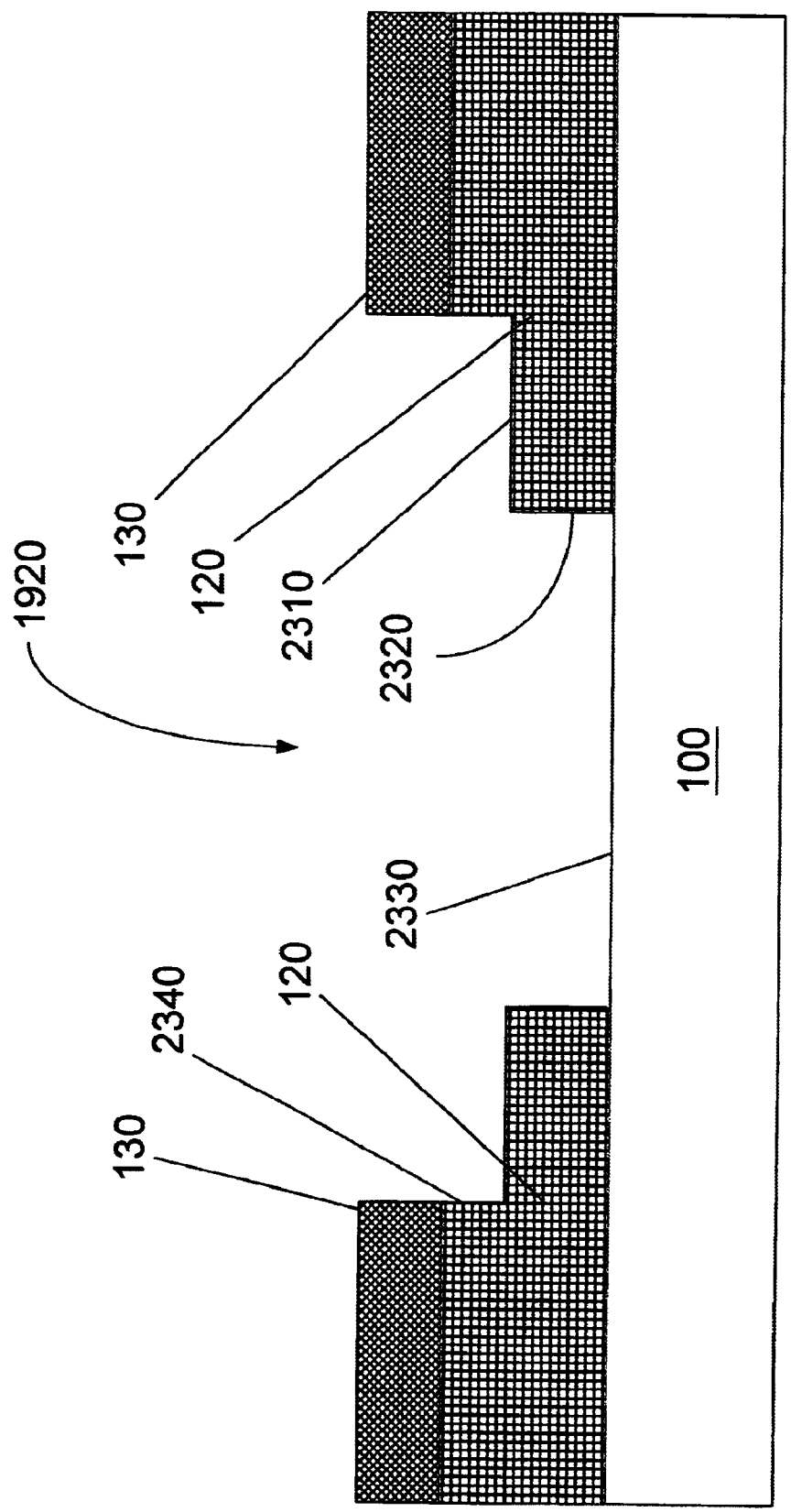

FIG. 24 illustrates an alternative result from the third anisotropic etching process. In the illustration of FIG. 24, the third anisotropic etching process has been selected such that it will etch the ARC layer 1960, the second cap layer 1980, and at least a portion of the first cap layer 130. That is, the cap layer 130 will be thinned during the third anisotropic etching process. By selecting an appropriate third anisotropic etching process, the first cap layer 130 may be completely, or substantially completely, removed during the third anise tropic etching process. Alternatively, the first cap layer 130 may be allowed to remain in its entirety, and the third anisotropic etching process may etch some or all of the second cap layer 1980.

Following the third anisotropic etching process, a conductive interconnect and trench may be formed as discussed in connection with FIGS. 7–9. In particular, referring to FIG. 24, the barrier layer may be formed over the surface 2330 of the structure layer 100, along the sidewalls 2320 and 2340 in the first process layer 120, and over the surface 2310 in the first process layer 120. That portion of the conductive material that ultimately overlays the surface 2330 of the structure layer 100 may comprise, for example, a conductive plug, whereas that portion of the conductive material that ultimately overlays the surface 2310 in the first process layer 120 may comprise, for example, a conductive trench. If any portion of the first cap layer 130, the second cap layer 1980 and/or the ARC layer 1960 remains following the third anisotropic etch, all or a portion of those layers may be removed, if desired, by a chemical mechanical polishing (CMP) process used to remove excess conductive material during formation of the conductive plug and trench. This CMP step was described in connection with FIGS. 8 and 9.

Figure 25:
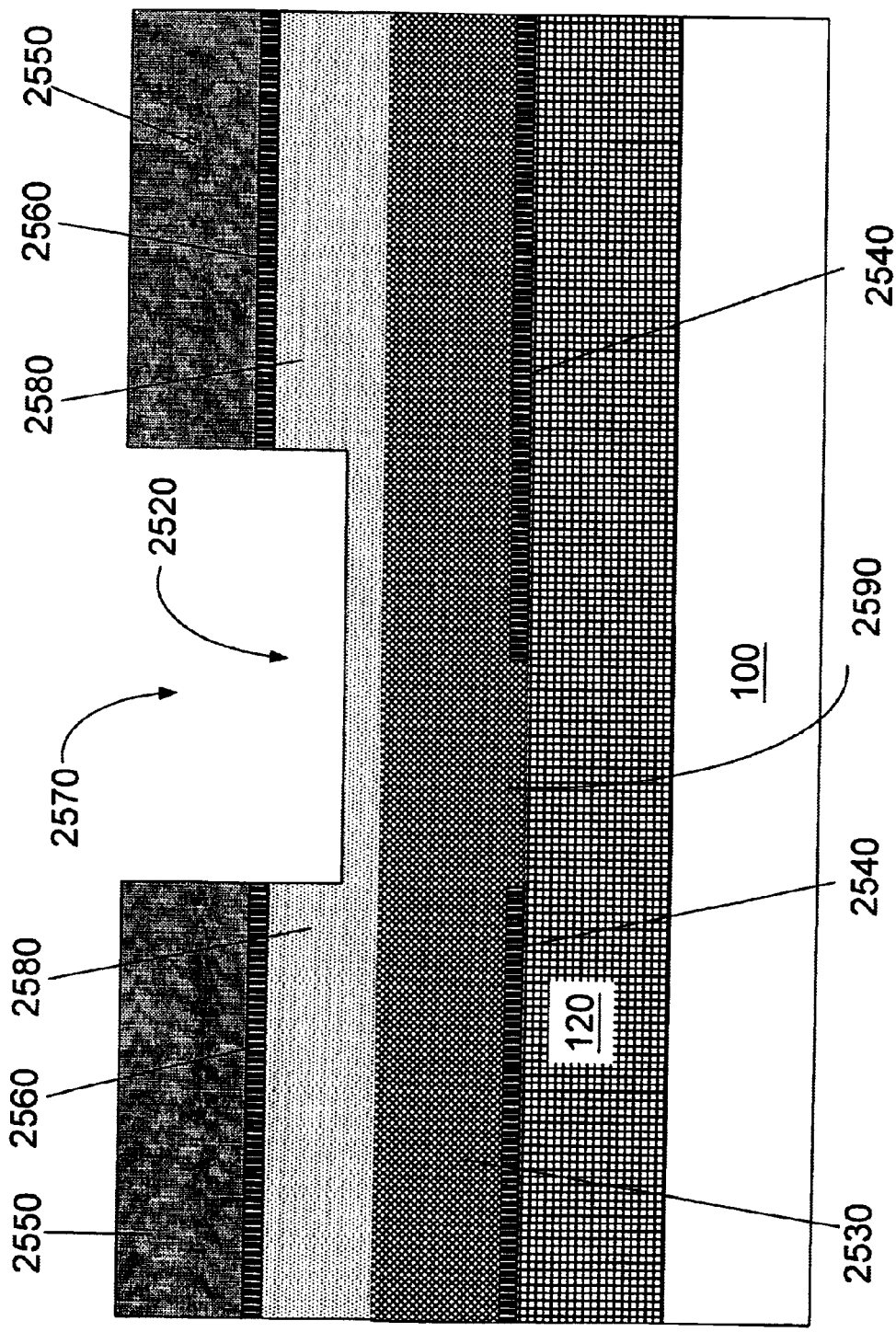
FIGS. 25–28 schematically illustrate yet another dual-damascene copper interconnect process flow according to various embodiments of the present invention.

FIGS. 25–28 schematically illustrate yet another dual-damascene copper interconnect process flow utilizing various aspects of the present invention. Referring to FIG. 25, a structure layer 100 has formed above it a first process layer 120. As before, the first process layer 120 may comprise a dielectric layer, and in particular, a low k dielectric layer. A buried hard mask 2540 may be formed above the first process layer 120. The hard mask 2540 may be comprised of a variety of materials, e.g., silicon nitride, TEOS oxide, etc. The hard mask 2540 may have an opening 2590 therein. A second process layer 2530 is formed above the first process layer 120 and above the hard mask 2540. In the opening 2590 in the hard mask a 2540, the second process layer 2530 adjoins the first process layer 120. A cap layer 2580 is formed above the second process layer 2530, and an ARC layer 2560 is formed above the cap layer 2580. A layer of photoresist material 2550 is formed above the ARC layer 2560, and an opening 2570 is formed in the layer of the photoresist material 2550. A first anisotropic etching process is performed through the opening 2570 to form the etched region 2520 that includes the ARC layer 2560 and a portion of the cap layer 2580.

Figure 26:
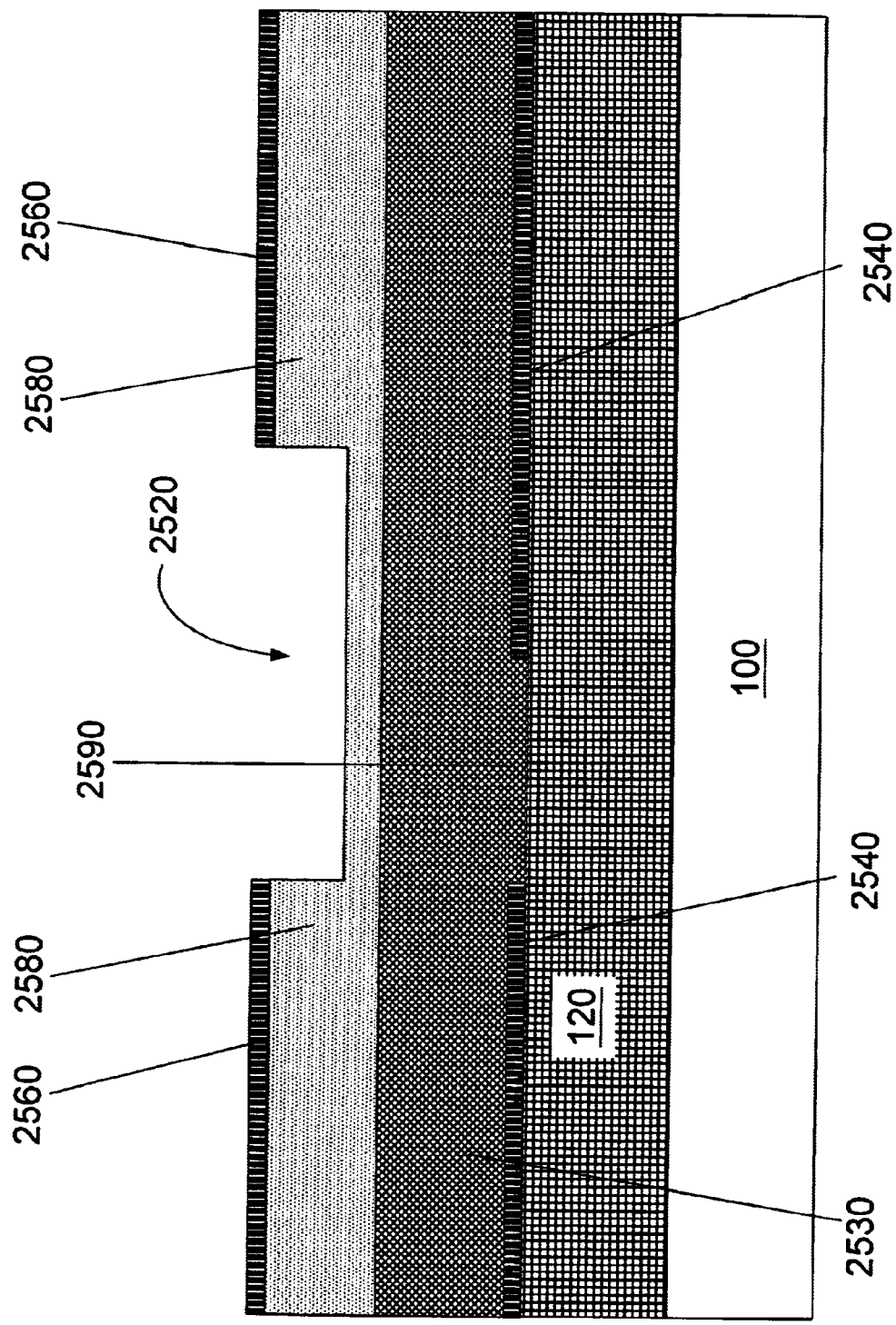

Referring to FIG. 26, following the first anisotropic etching process, the layer of photoresist material 2550 is removed from atop the ARC layer 2560, for example, by ashing or other suitable process. Because the first process layer 120 and the second process layer 2530 are protected by at least a portion of the cap layer 2580, they are not exposed to potential damage that could be caused by removal of the layer of photoresist material 2550.

Figure 27:
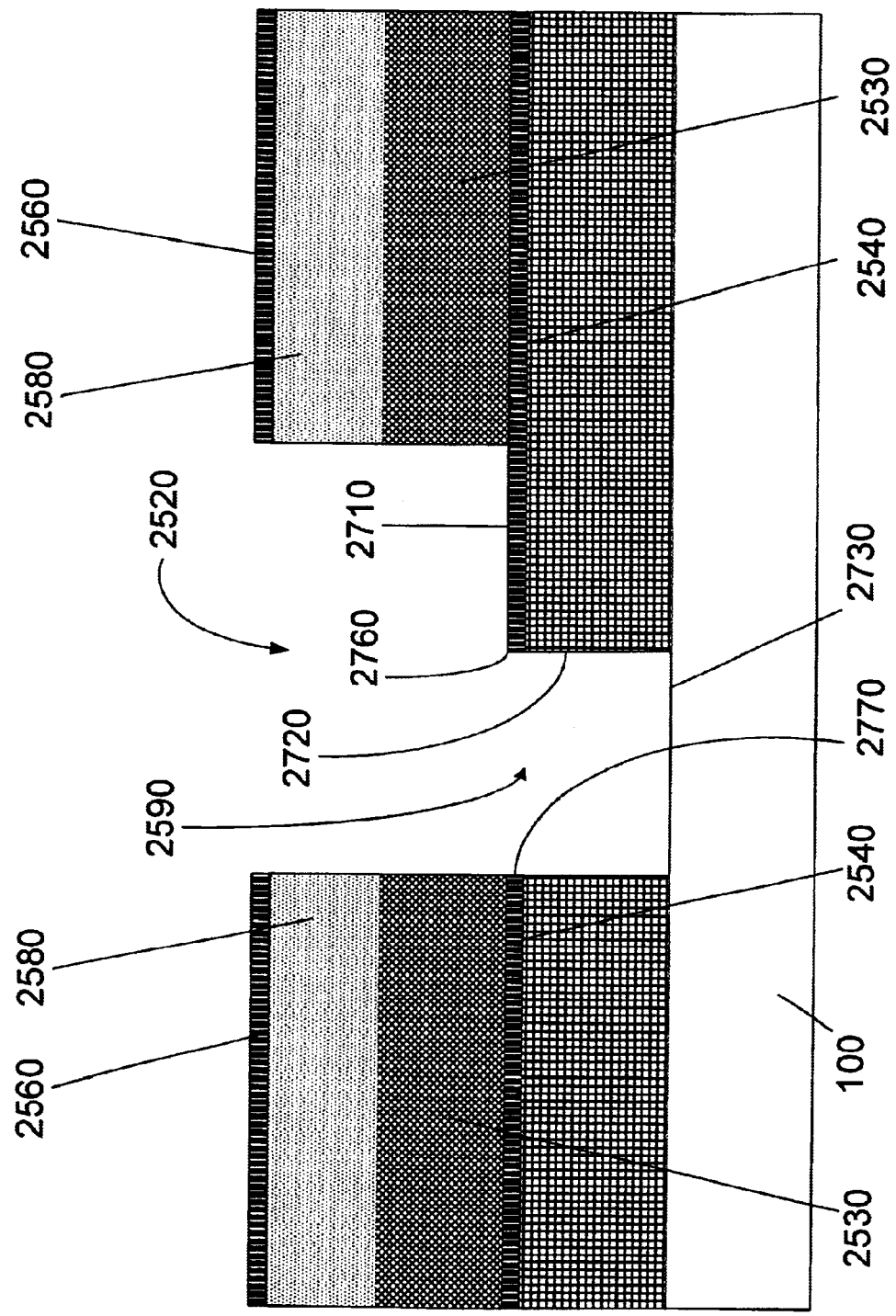

Referring now to FIG. 27, following removal of the layer of photoresist material 2550, a subsequent anisotropic etching process is performed. In the illustration of FIG. 27, this subsequent anisotropic etching process is chosen such that the ARC layer 2560 will not be consumed. As a result, the cap layer 2580 underlying the ARC layer 2560 will also not be consumed. The subsequent anisotropic etching process extends the etched region 2520 to an upper surface 2710 of the hard mask 2540. In the region of the opening 2590 in the hard mask 2540, the subsequent anisotropic etching process will extend the etched region 2520 to an upper surface 2730 of the structure layer 100. A sidewall 2720 is created in the first process layer 120 which is substantially aligned with an edge 2760 of the hard mask 2540. A sidewall 2740 in the etched region 2520 is substantially aligned with an edge 2770 of the hard mask 2540.

Figure 28:
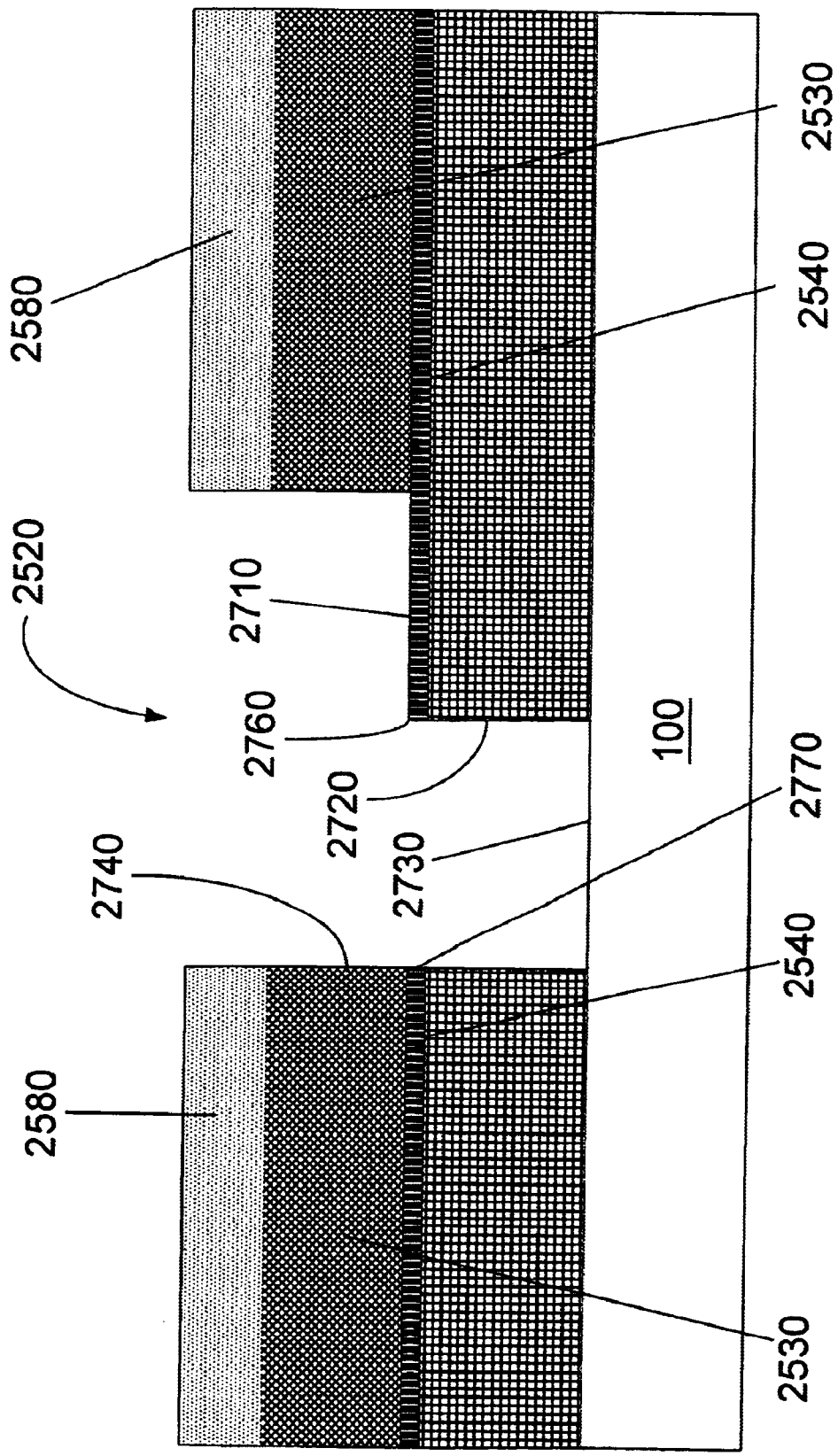

Referring to FIG. 28, the subsequent anisotropic etching process following the removal of the layer of photoresist material 2550 may be chosen to remove the ARC layer 2560 and at least a portion of the cap layer 2580. Alternatively, the subsequent anisotropic etching process may be chosen to remove the ARC layer 2560 and all or substantially all of the cap layer 2580.

Following the subsequent anisotropic etching process, as illustrated in FIGS. 27 and 28, for example, the formation of an interconnect may be completed as discussed in connection with FIGS. 7–9. That is, a barrier metal layer may be deposited along the top surface of the sandwiched structure and in the opening 2520, following by a copper seed layer, for example, and an electroplating of a copper material to fill the opening 2520. Subsequent chemical mechanical polishing steps may be performed to remove any excess conductive material along with any desirable portion of the remaining ARC layer 2560 and cap layer 2580.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for patterning a process layer in a semiconductor device, comprising:
   forming the process layer above a structure layer;
   forming a cap layer above the process layer;
   forming a photoresist layer above the cap layer;
   forming an opening in the photoresist layer;
   performing a first anisotropic etch into a region of the cap layer underlying the opening in the photoresist layer to form an etched region in the cap layer, leaving a portion of the cap layer in the etched region;
   removing the photoresist layer from above the cap layer; and
   performing a second anisotropic etch to form an etch pattern in the process layer.

2. The method of claim 1, wherein forming the process layer above a structure layer comprises forming a dielectric layer above a structure layer.

3. The method of claim 2, wherein forming a dielectric layer above a structure layer comprises depositing a dielectric layer above a structure layer.

4. The method of claim 3, wherein depositing a dielectric layer above a structure layer comprises depositing a dielectric layer of a material having a dielectric constant less than approximately 4 above a structure layer.

5. The method of claim 1, wherein forming a cap layer above the process layer comprises depositing a cap layer of at least one of TEOS oxide, silicon nitride and silicon carbide above the process layer.

6. The method of claim 1, further comprising forming an anti-reflective coating layer above the cap layer before forming a photoresist layer above the cap layer.

7. The method of claim 6, wherein performing a first anisotropic etch into a region of the cap layer underlying the opening in the photoresist layer comprises performing a first anisotropic etch through a region of the anti-reflective coating layer underlying the opening in the photoresist layer and into a region of the cap layer underlying the opening in the photoresist layer.

8. The method of claim 7, further comprising removing all of the anti-reflective coating layer and at least substantially all of the cap layer while performing the second anisotropic etch.

9. The method of claim 7, further comprising removing the anti-reflective coating layer and the cap layer.

10. The method of claim 7, further comprising:
    removing a portion of the anti-reflective coating layer while performing the second anisotropic etch; and
    thereafter, removing a remaining portion of the anti-reflective coating layer and removing at least substantially all of the cap layer.

11. The method of claim 10, wherein removing a remaining portion of the anti-reflective coating layer and removing at least substantially all of the cap layer comprises removing a remaining portion of the anti-reflective coating layer by a chemical mechanical polishing process and removing at least substantially all of the cap layer by a chemical mechanical polishing process.

12. The method of claim 6, wherein forming an anti-reflective coating layer above the cap layer comprises forming an anti-reflective coating layer of at least one of silicon nitride, silicon oxynitride and silicon carbide above the cap layer.

13. The method of claim 12, wherein forming a cap layer above the process layer comprises forming a cap layer of at least one of TEOS oxide, silicon nitride and silicon carbide above the process layer.

14. The method of claim 1, wherein removing the photoresist layer from above the cap layer comprises ashing the photoresist layer from above the cap layer.

15. The method of claim 1, wherein performing a first anisotropic etch into a region of the cap layer underlying the opening in the photoresist layer comprises performing a first anisotropic etch by one of plasma etching and wet chemical etch into a region of the cap layer underlying the opening in the photoresist layer.

16. The method of claim 1, wherein performing a second anisotropic etch to form an etch pattern in the process layer comprises performing a second anisotropic etch by one of plasma etching and wet chemical etch to form an etch pattern in the process layer.

17. The method of claim 1, further comprising removing at least substantially all of the cap layer while performing the second anisotropic etch.

18. The method of claim 1, further comprising:
    thinning the cap layer while performing the second anisotropic etch; and
    thereafter, removing a remaining portion of the cap layer.

19. The method of claim 18, wherein removing a remaining portion of the cap layer comprises removing a remaining portion of the cap layer by a chemical mechanical polishing process.

20. The method of claim 1, further comprising removing the cap layer.

21. The method of claim 1, wherein the structure layer comprises a semiconductor substrate.

22. The method of claim 1, wherein the structure layer comprises a layer of conductive material.

23. The method of claim 22, wherein the layer of conductive material comprises a patterned layer of conductive material.

24. A method for forming a conductive interconnect in a semiconductor device, comprising:
    forming a dielectric layer above a structure layer;
    forming a cap layer above the dielectric layer;
    forming a photoresist layer above the cap layer;
    forming an opening in the photoresist layer;
    performing a first anisotropic etch into a region of the cap layer underlying the opening in the photoresist layer to form an etched region in the cap layer, leaving a portion of the cap layer in the etched region;

removing the photoresist layer from above the cap layer;

performing a second anisotropic etch to form an opening in the dielectric layer, the opening in the dielectric layer having a sidewall;

forming a barrier layer above at least the sidewall of the opening in the dielectric layer;

forming a conductive material in at least the opening in the dielectric layer; and removing the cap layer.

25. The method of claim 24, wherein forming a dielectric layer above a structure layer comprises depositing a dielectric layer above a structure layer.

26. The method of claim 25, wherein depositing a dielectric layer above a structure layer comprises depositing a dielectric layer of a material having a dielectric constant less than approximately 4 above a structure layer.

27. The method of claim 25, wherein depositing a dielectric layer above a structure layer comprises depositing a dielectric layer of silicon dioxide above a structure layer.

28. The method of claim 25, wherein depositing a dielectric layer above a structure layer comprises depositing a dielectric layer of a material having a dielectric constant less than about 4.0 above a structure layer.

29. The method of claim 24, wherein forming a cap layer above the dielectric layer comprises depositing a cap layer of at least one of TEOS oxide, silicon nitride and silicon carbide above the dielectric layer.

30. The method of claim 24, wherein removing the photoresist layer from above the cap layer comprises ashing the photoresist layer from above the cap layer.

31. The method of claim 24, wherein performing a first anisotropic etch into a region of the cap layer underlying the opening in the photoresist layer comprises performing a first anisotropic etch by one of plasma etch and wet chemical etch into a region of the cap layer underlying the opening in the photoresist layer.

32. The method of claim 24, wherein performing a second anisotropic etch to form an opening in the dielectric layer comprises performing a second anisotropic etch by one of plasma etch and wet chemical etch to form an opening in the dielectric layer.

33. The method of claim 24, wherein forming a barrier layer above at least the sidewall of the opening in the dielectric layer comprises forming a layer of at least one of tantalum, tantalum nitride and titanium nitride above at least the sidewalls of the opening in the dielectric layer.

34. The method of claim 24, wherein forming a barrier layer above at least the sidewall of the opening in the dielectric layer comprises forming a layer of at least one of titanium-tungsten, nitrided titanium-tungsten, and magnesium above at least the sidewall of the opening in the dielectric layer.

35. The method of claim 24, wherein forming a conductive material in at least the opening in the dielectric layer comprises forming a conductive material of copper in at least the opening in the dielectric layer.

36. The method of claim 24, wherein removing the cap layer comprises removing the cap layer by a chemical mechanical polishing process.

37. The method of claim 24, wherein performing a second anisotropic etch to form an opening in the dielectric layer comprises performing a second anisotropic etch to form an opening in the dielectric layer and to thin the cap layer.

38. The method of claim 37, wherein removing the cap layer comprises removing a remaining portion of the cap layer.

39. The method of claim 24, wherein forming a conductive material in at least the opening in the dielectric layer comprises:

depositing a copper seed layer above the barrier layer; and forming copper material in the opening using an electroplating process.

40. The method of claim 39, further comprising performing a chemical mechanical polishing process to remove an excess of copper.

41. The method of claim 40, wherein removing the ca p layer comprises removing the cap layer by a chemical mechanical polishing process.

42. The method of claim 24, wherein the structure layer comprises a semiconductor substrate.

43. The method of claim 24, wherein the structure layer comprises a layer of conductive material.

44. The method of claim 43, wherein the layer of conductive material comprises a patterned layer of conductive material.

45. A method for forming a conductive interconnect in a semiconductor device, comprising:

forming a first process layer above a semiconductor substrate;

forming a second process layer above the first process layer;

forming a mask above the second process layer, the mask having an opening therein;

performing a first anisotropic etch into a region of the second process layer underlying the opening in the mask, leaving a portion of the second process layer in the etched region;

removing the mask from above the second process layer;

performing a second anisotropic etch to form an opening in the first process layer; and forming a conductive material in the opening in the first process layer.

46. The method of claim 45, wherein forming a first process layer comprises forming a first process layer of a dielectric material.

47. The method of claim 46, wherein the dielectric material comprises a dielectric material having a dielectric constant less than approximately 4.

48. The method of claim 46, wherein the dielectric material comprises at least one of silicon dioxide, and a material having a dielectric constant of less than about 4.0.

49. The method of claim 45, wherein forming a second process layer above the first process layer comprises forming a cap layer above the first process layer.

50. The method of claim 49, wherein forming a cap layer above the first process layer comprises forming a layer of at least one of TEOS oxide, silicon nitride and silicon carbide above the first process layer.

51. The method of claim 45, wherein forming a mask above the second process layer comprises forming a mask above the second process layer using a photoresist material.

52. The method of claim 51, wherein removing the mask from above the second process layer comprises ashing the photoresist material from above the second process layer.

53. The method of claim 45, wherein performing a second anisotropic etch to form an opening in the first process layer comprises performing a second anisotropic etch to form an opening in the first process layer and to thin the second process layer.

54. The method of claim 45, wherein performing a second anisotropic etch to form an opening in the first process layer comprises performing a second anisotropic etch to form an opening in the first process layer and to remove at least substantially all of the second process layer from above the first process layer.

55. The method of claim 45, wherein forming a conductive material in the opening in the first process layer comprises forming a conductive material of copper in the opening in the first process layer.

56. The method of claim 45, further comprising depositing a copper seed layer in at least the opening in the first process layer before forming a conductive material.

57. The method of claim 56, wherein forming a conductive material in the opening in the first process layer comprises forming a conductive material of copper in the opening in the first process layer by using an electroplating process.

58. The method of claim 45, further comprising forming a barrier layer in at least the opening in the first process layer before forming a conductive material in the opening in the first process layer.

59. A method for patterning a process layer in a semiconductor device, comprising:

forming a process layer above a structure layer;

forming a cap layer above the process layer;

forming a first photoresist layer above the cap layer;

forming a first opening in the first photoresist layer;

performing a first anisotropic etching process into a region of the cap layer underlying the first opening in the first photoresist layer to form an etched region in the cap layer, leaving a portion of the cap layer in the etched region;

removing the first photoresist layer from above the cap layer;

forming a second photoresist layer above the cap layer;

forming a second opening in the second photoresist layer;

performing a second anisotropic etching process into a region of the cap layer underlying the second opening in the second photoresist layer to enlarge the etched region in the cap layer, leaving a second portion of the cap layer in the etched region;

removing the second photoresist layer from above the cap layer; and performing a third anisotropic etching process to form an etched pattern in the process layer.

60. The method of claim 59, wherein forming a process layer above the structure layer comprises forming a dielectric layer above the structure layer.

61. The method of claim 60, wherein forming a dielectric layer above the structure layer comprises depositing a dielectric layer above the structure layer.

62. The method of claim 61, wherein depositing a dielectric layer above the structure layer comprises depositing a dielectric layer of a material having a dielectric constant less than approximately 4 above the structure layer.

63. The method of claim 59, wherein forming a cap layer above the process layer comprises depositing a cap layer of at least one of TEOS oxide, silicon nitride and silicon carbide above the process layer.

64. The method of claim 59, further comprising forming an anti-reflective coating layer above the cap layer before forming the first photoresist layer above the cap layer.

65. The method of claim 64, wherein performing a first anisotropic etching process into a region of the cap layer underlying the first opening in the first photoresist layer reflective coating layer underlying the first opening in the first photo resist layer and into a region of the cap layer underlying the first opening in the first photoresist layer.

66. The method of claim 65, further comprising removing all of the anti-reflective coating layer and at least substantially all of the cap layer while performing the third anisotropic etching process.

67. The method of claim 65, further comprising removing the anti-reflective coating layer and the cap layer.

68. The method of claim 67, wherein removing the anti-reflective coating and the cap layer comprises removing the anti-reflective coating layer and the cap layer by a chemical mechanical polishing process.

69. The method of claim 64, wherein forming an anti-reflective coating layer above the cap layer comprises forming an anti-reflective coating layer of at least one of silicon nitride, silicon oxynitride and silicon carbide above the cap layer.

70. The method of claim 59, wherein removing the first photoresist layer from above the cap layer comprises ashing the first photoresist layer from above the cap layer.

71. The method of claim 70, wherein removing the second photoresist layer from above the cap layer comprises ashing the second photoresist layer from above the cap layer.

72. The method of claim 59, wherein removing the second photoresist layer from above the cap layer comprises ashing the second photoresist layer from above the cap layer.

73. The method of claim 59, further comprising removing at least substantially all of the cap layer while performing the third anisotropic etching process.

74. The method of claim 59, further comprising:

thinning the cap layer while performing the third anisotropic etching process; and thereafter, removing a remaining portion of the cap layer.

75. The method of claim 74, wherein removing a remaining portion of the cap layer comprises removing a remaining portion of the cap layer by a chemical mechanical polishing process.

76. The method of claim 59, wherein the structure layer comprises a semiconductor substrate.

77. The method of claim 59, wherein the structure layer comprises a layer of conductive material.

78. A method for patterning a process layer in a semiconductor device, comprising:

forming a process layer above a structure layer;

forming a first cap layer above the process layer;

forming a second cap layer above the first cap layer;

forming a first photoresist layer above the second cap layer;

forming a first opening in the first photoresist layer;

performing a first anisotropic etching process into a region of the second cap layer underlying the first opening in the first photoresist layer to form an etched region in the second cap layer;

removing the first photoresist layer from above the second cap layer;

forming a second photoresist layer above the second cap layer;

forming a second opening in the second photoresist layer, the second opening in the second photoresist layer overlying the etched region in the second cap layer;

performing a second anisotropic etching process into a region of the second cap layer underlying the second opening in the second photoresist layer and into a region of the first cap layer underlying the second opening in the second photoresist layer to form a second etched region in the first and second cap layers, leaving at least a portion of the first cap layer in the second etched region;

removing the second photoresist layer from above the second cap layer; and performing a third anisotropic etching process to form an etched pattern in the process layer.

79. The method of claim 78, wherein forming a process layer above a structure layer comprises forming a dielectric layer above a structure layer.

80. The method of claim 79, wherein forming a dielectric layer above a structure layer comprises depositing a dielectric layer above a structure layer.

81. The method of claim 80, wherein depositing a dielectric layer above a structure layer comprises depositing a dielectric layer of a material having a dielectric constant less than approximately 4 above a structure layer.

82. The method of claim 78, wherein forming a first cap layer above the process layer comprises depositing a first cap layer of at least one of TEOS oxide, silicon nitride and silicon carbide above the process layer.

83. The method of claim 78, wherein forming a second cap layer above the first cap layer comprises depositing a second cap layer of at least one of TEOS oxide, silicon nitride and silicon carbide above the first cap layer.

84. The method of claim 78, further comprising forming an anti-reflective coating layer above the second cap layer before forming the first photoresist layer above the second cap layer.

85. The method of claim 84, wherein performing a first anisotropic etching process into a region of the second cap layer under lying the first opening in the first photoresist layer comprises performing a first anisotropic etching process through a region of the anti-reflective coating layer underlying the first opening in the first photoresist layer and into a region of the second cap layer underlying the first opening in the first photoresist layer.

86. The method of claim 85, further comprising removing all of the anti-reflective coating layer and at least substantially all of the second cap layer while performing the third anisotropic etching process.

87. The method of claim 85, further comprising removing all of the anti-reflective coating layer, all of the second cap layer, and at least substantially all of the first cap layer while performing the third anisotropic etching process.

88. The method of claim 85, further comprising removing the anti-reflective coating layer, the second cap layer and the first cap layer.

89. The method of claim 84, wherein forming an anti-reflective coating layer above the second cap layer comprises forming an anti-reflective coating layer of at least one silicon nitride, silicon oxynitride and silicon carbide above the second cap layer.

90. The method of claim 89, wherein forming a first cap layer above the process layer comprises forming a first cap layer of at least one of TEOS oxide, silicon nitride and silicon carbide above the process layer.

91. The method of claim 89, wherein forming a second cap layer above the first cap layer comprises forming a second cap layer of at least one of TEOS oxide, silicon nitride and silicon carbide above the first cap layer.

92. The method of claim 78, wherein removing the first photoresist layer from above the second cap layer comprises ashing the first photoresist layer from above the second cap layer.

93. The method of claim 78, wherein removing the second photoresist layer from above the second cap layer comprises ashing the second photoresist layer from above the second cap layer.

94. The method of claim 78, further comprising removing at least substantially all of the first cap layer while performing the third anisotropic etching process.

95. The method of claim 78, further comprising removing at least substantially all of the second cap layer while performing the third anisotropic etching process.

96. The method of claim 78, further comprising:
thinning the first cap layer while performing the third anisotropic etching process; and
thereafter, removing a remaining portion of the first cap layer.

97. The method of claim 96, wherein removing a remaining portion of the first cap layer comprises removing a remaining portion of the first cap layer by a chemical mechanical polishing process.

98. The method of claim 78, wherein the structure layer comprises a semiconductor substrate.

99. The method of claim 78, wherein the structure layer comprises a layer of conductive material.

100. The method of claim 99, wherein the layer of conductive material comprises a patterned layer of conductive material.

101. A method for patterning first and second process layers in a semiconductor device, comprising:
forming a first process layer above a structure layer;
forming a hard mask layer above the first process layer, the hard mask layer having an opening therein;
forming a second process layer above the hard mask layer and above the opening in the hard mask layer;
forming a cap layer above the second process layer;
forming a photoresist layer above the cap layer;
forming an opening in the photoresist layer;
performing a first anisotropic etching process into a region of the cap layer underlying the opening in the photoresist layer to form an etched region in the cap layer, leaving a portion of the cap layer in the etched region;
removing the photoresist layer from above the cap layer; and
performing a second anisotropic etching process to extend at least a portion of the etched region in the cap layer to a surface of the structure layer.

102. The method of claim 101, wherein forming the first process layer above a structure layer comprises forming a first dielectric layer above a structure layer.

103. The method of claim 101, wherein forming a second process layer above the hard mask layer and above the opening in the hard mask layer comprises forming a second dielectric layer above the hard mask layer and above the opening in the hard mask layer.

104. The method of claim 102, wherein forming a first dielectric layer above the structure layer comprises depositing a first dielectric layer above the structure layer.

105. The method of claim 103, wherein forming a second dielectric layer comprises depositing a second dielectric layer.

106. The method of claim 104, wherein depositing a first dielectric layer comprises depositing a first dielectric layer of a material having a dielectric constant less than approximately 4.

107. The method of claim 105, wherein depositing a second dielectric layer comprises depositing a second dielectric layer of a material having a dielectric constant less than approximately 4.

108. The method of claim 101, wherein forming a cap layer above the second process layer comprises depositing a cap layer of at least one of TEOS oxide, silicon nitride and silicon carbide above the second process layer.

109. The method of claim 101, further comprising forming an anti-reflective coating layer above the cap layer before forming a photoresist layer above the cap layer.

110. The method of claim 109, wherein performing a first anisotropic etching process into a region of the cap layer underlying the opening in the photoresist layer comprises performing a first anisotropic etching process through a region of the anti-reflective coating layer underlying the opening in the photoresist layer and into a region of the cap layer underlying the opening in the photoresist layer.

111. The method of claim 110, further comprising removing all of the anti-reflective coating layer and at least substantially all of the cap layer while performing the second anisotropic etching process.

112. The method of claim 110, further comprising:
  removing a portion of the anti-reflective coating layer while performing the second anisotropic etching process; and
  thereafter, removing a remaining portion of the anti-reflective coating layer and removing at least substantially all of the cap layer.

113. The method of claim 109, wherein forming an anti-reflective coating layer above the cap layer comprises forming an anti-reflective coating layer of at least one of silicon nitride, silicon oxynitride and silicon carbide above the cap layer.

114. The method of claim 113, wherein forming a cap layer above the second process layer comprises forming a cap layer of at least one of TEOS oxide, silicon nitride and silicon carbide above the second process layer.

115. The method of claim 101, wherein removing the photoresist layer from above the cap layer comprises ashing the photoresist layer from above the cap layer.

116. The method of claim 101, wherein performing a first anisotropic etching process into a region of the cap layer underlying the opening in the photoresist layer comprises performing a first anisotropic etching process by one of plasma etching and wet chemical etching into a region of the cap layer underlying the opening in the photoresist layer.

117. The method of claim 101, wherein performing a second anisotropic etching process comprises performing a second anisotropic etching process by plasma etching.

118. The method of claim 101, further comprising removing at least substantially all of the cap layer while performing the second anisotropic etching process.

119. The method of claim 101, further comprising:
  thinning the cap layer while performing the second anisotropic etching process; and
  thereafter, removing a remaining portion of the cap layer.

120. The method of claim 119, wherein removing a remaining portion of the cap layer comprises removing a remaining portion of the cap layer by a chemical mechanical polishing process.

121. The method of claim 101, wherein the structure layer comprises a semiconductor substrate.

122. The method of claim 101, wherein the structure layer comprises a layer of conductive material.

123. The method of claim 122, wherein the layer of conductive material comprises a patterned layer of conductive material.

* * * * *